US012694861B2

(12) United States Patent
Yu et al.

(10) Patent No.: US 12,694,861 B2
(45) Date of Patent: Jul. 28, 2026

(54) HEADSET WITH ACTIVE NOISE CANCELLATION FUNCTION AND ACTIVE NOISE CANCELLATION METHOD

(71) Applicant: HUAWEI TECHNOLOGIES CO., LTD., Shenzhen (CN)

(72) Inventors: Xiaowei Yu, Shenzhen (CN); Jiasheng Li, Shenzhen (CN); Guopeng Wu, Shenzhen (CN); Shan Ouyang, Shenzhen (CN); Yulong Li, Shenzhen (CN); Fan Fan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 195 days.

(21) Appl. No.: 18/676,619

(22) Filed: May 29, 2024

(65) Prior Publication Data

US 2024/0312447 A1     Sep. 19, 2024

Related U.S. Application Data

(63) Continuation of application No. PCT/CN2022/130025, filed on Nov. 4, 2022.

(30) Foreign Application Priority Data

Nov. 30, 2021    (CN) .......................... 202111442378.3

(51) Int. Cl.
*G10K 11/178*        (2006.01)
*H03G 3/30*        (2006.01)
(52) U.S. Cl.
CPC .. *G10K 11/17823* (2018.01); *G10K 11/17817* (2018.01); *G10K 11/17825* (2018.01);
(Continued)

(58) Field of Classification Search
CPC ....... G10K 11/17823; G10K 11/17825; G10K 11/17881; G10K 11/17817;
(Continued)

(56) References Cited

U.S. PATENT DOCUMENTS 10,540,955 B1    1/2020  Milani et al.
11,962,968 B2 *  4/2024  Li ...................  G10K 11/17827
(Continued)

FOREIGN PATENT DOCUMENTS

CN        107005758 A      8/2017
CN        111836147 A     10/2020
(Continued)

OTHER PUBLICATIONS

International Search Report and Written Opinion issued in PCT/CN2022/130025, dated Jan. 19, 2023, 12 pages.

*Primary Examiner* — David L Ton

(57)        ABSTRACT

A headset with the active noise cancellation (ANC) function includes an ANC module, a plurality of speakers, a plurality of power drive circuits, and at least one reference microphone. An output end of any one of the plurality of power drive circuits is connected to at least one of the plurality speakers. The ANC module is connected between at least one reference microphone and input ends of the plurality of power drive circuits. The at least one reference microphone is configured to collect at least one first ambient noise signal. The ANC module is configured to obtain at least one mixed audio signal. The plurality of power drive circuits is configured to perform power amplification on the at least one mixed audio signal based on respective output powers to obtain at least one power-amplified mixed audio signal.

19 Claims, 13 Drawing Sheets

(52) U.S. Cl.
   CPC ................. *G10K 11/17881* (2018.01); *G10K 2210/1081* (2013.01); *G10K 2210/3026* (2013.01); *G10K 2210/3027* (2013.01); *G10K 2210/3028* (2013.01); *G10K 2210/3056* (2013.01); *H03G 3/3005* (2013.01); *H03G 2201/103* (2013.01)

(58) Field of Classification Search
   CPC ... G10K 2210/1081; G10K 2210/3026; G10K 2210/3027; G10K 2210/3028; G10K 2210/3056; H03G 3/3005; H03G 2201/103; H04R 2205/022; H04R 2460/01
   See application file for complete search history.

(56) References Cited

U.S. PATENT DOCUMENTS

| | | | |
|---|---|---|---|
| 2014/0270222 A1 | 9/2014 | Hendrix et al. | |
| 2016/0171962 A1 | 6/2016 | Jenkins | |
| 2016/0300562 A1 | 10/2016 | Goldstein | |
| 2016/0316297 A1 | 10/2016 | Yang et al. | |
| 2023/0254630 A1* | 8/2023 | Sato | ................. G10K 11/17873 381/74 |

FOREIGN PATENT DOCUMENTS

| | | |
|---|---|---|
| KR | 20210110332 A | 9/2021 |
| WO | 2021140182 A1 | 7/2021 |

* cited by examiner

10

20

Wired connection or
wireless connection

Control signal

Audio signal

FF module 111

(a)

FF module 111+FF module 113

(b)

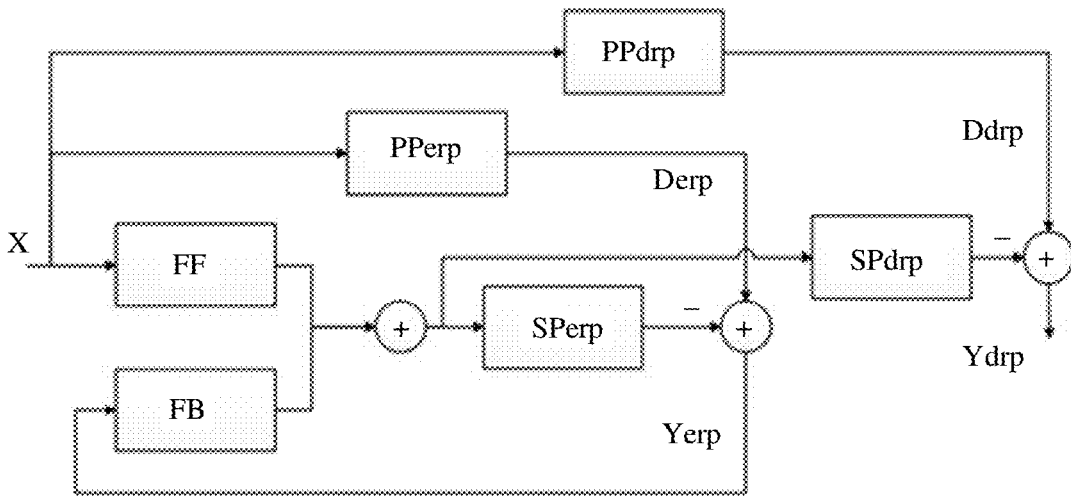

FIG. 17

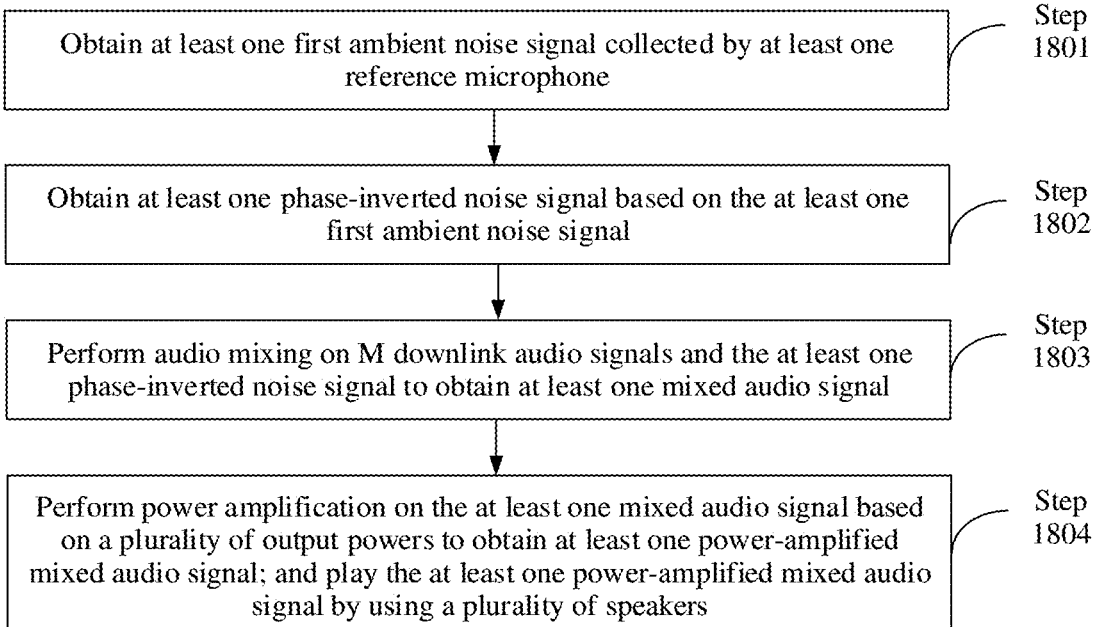

| | |
|---|---|
| Obtain at least one first ambient noise signal collected by at least one reference microphone | Step 1801 |
| Obtain at least one phase-inverted noise signal based on the at least one first ambient noise signal | Step 1802 |
| Perform audio mixing on M downlink audio signals and the at least one phase-inverted noise signal to obtain at least one mixed audio signal | Step 1803 |
| Perform power amplification on the at least one mixed audio signal based on a plurality of output powers to obtain at least one power-amplified mixed audio signal; and play the at least one power-amplified mixed audio signal by using a plurality of speakers | Step 1804 |

FIG. 18

HEADSET WITH ACTIVE NOISE CANCELLATION FUNCTION AND ACTIVE NOISE CANCELLATION METHOD

CROSS-REFERENCE TO RELATED APPLICATIONS

This application is a continuation of International Application No. PCT/CN2022/130025, filed on Nov. 4, 2022, which claims priority to Chinese Patent Application No. 202111442378.3, filed on Nov. 30, 2021. The disclosures of the aforementioned applications are hereby incorporated by reference in their entireties.

TECHNICAL FIELD

This application relates to the field of multimedia technologies, and in particular, to a headset with an active noise cancellation function and an active noise cancellation method.

BACKGROUND

With the development of science and technology, various electronic devices are widely used, for example, a smartphone, a tablet computer, and a smart television. When the electronic device is used, a user may implement a function such as listening to music or making a call by using a headset connected to the electronic device. When there is ambient noise, clarity of the music or a voice signal heard by the user is affected by the ambient noise. When there is severe ambient noise, the user even cannot clearly hear the music or the voice signal in the headset, which affects user experience of the headset wearer. A noise cancellation headset can reduce impact of the ambient noise on the user experience of the headset wearer. The noise cancellation headsets may be usually classified into a passive noise cancellation headset and an active noise cancellation headset based on a used noise cancellation technology.

A working principle of the active noise cancellation headset is as follows: An audio signal collected by a microphone of the headset is processed, and then played by using a speaker of the headset; and an audio signal whose amplitude is the same as that of the ambient noise and whose phase is opposite to that of the ambient noise is generated in an ear, to cancel the ambient noise, so that noise heard by the headset wearer is reduced. The active noise cancellation headset can reduce interference of the ambient noise to the headset wearer, thereby improving clarity and intelligibility of the music or the voice signal.

However, how to improve noise cancellation effect of the headset has become a technical problem that needs to be urgently resolved.

SUMMARY

Embodiments of this application provide a headset with an active noise cancellation function and an active noise cancellation method, to improve the noise cancellation capability of the headset, and help avoid pop noise.

According to a first aspect, an embodiment of this application provides a headset with an active noise cancellation function. The headset may include an active noise cancellation module, a plurality of speakers, a plurality of power drive circuits, and at least one reference microphone. An output end of any one of the plurality of power drive circuits is connected to at least one of the plurality of speakers, and the active noise cancellation module is connected between the at least one reference microphone and input ends of the plurality of power drive circuits. The at least one reference microphone is configured to collect at least one first ambient noise signal. The active noise cancellation module is configured to obtain at least one phase-inverted noise signal based on the at least one first ambient noise signal. The at least one phase-inverted noise signal is used to partially or totally cancel ambient noise. The active noise cancellation module is further configured to perform audio mixing on M downlink audio signals and the at least one phase-inverted noise signal to obtain at least one mixed audio signal, where M is any positive integer, and the M downlink audio signals come from an electronic device connected to the headset. The plurality of power drive circuits is configured to perform power amplification on the at least one mixed audio signal based on respective output powers to obtain at least one power-amplified mixed audio signal. The plurality of speakers is configured to play the at least one power-amplified mixed audio signal.

For example, the plurality of power drive circuits may be in a one-to-one correspondence with the plurality of speakers. For example, one power drive circuit is connected to one speaker. The plurality of power drive circuits may alternatively be in a one-to-multiple correspondence with the plurality of speakers. For example, one power drive circuit is connected to a plurality of speakers.

Therefore, in an implementation of the first aspect, the plurality of power drive circuits drive the plurality of speakers to play the phase-inverted noise signal and the downlink audio signal. In this way, more output powers can be used to provide higher output energy for the headset, to improve noise cancellation performance of the headset. When the headset is used to play an audio in a low-frequency and high-noise scenario, the headset has a high low-frequency output capability, thereby helping improve noise cancellation effect of the headset in the low-frequency and high-noise scenario. In addition, because an audio signal output capability of the headset is higher, a low-frequency gain of the active noise cancellation module may be lower. Therefore, in the low-frequency and high-noise scenario, when a low-frequency signal picked up by the microphone passes through the active noise cancellation module, pop noise can be avoided. This can improve low-frequency robustness of active noise cancellation.

The low-frequency and high-noise scenario may include a stable low-frequency and high-noise scenario and a transient low-frequency and high-noise scenario. For example, the stable low-frequency and high-noise scenario may be a scenario such as public transportation or air travel. The transient low-frequency and high-noise scenario may be a scenario such as a bus crossing a barrier, a train passing through a cave, or closing a door.

In an example embodiment, a quantity of the at least one phase-inverted noise signal is one. The active noise cancellation module is configured to separately perform audio mixing on the M downlink audio signals and one phase-inverted noise signal to obtain M mixed audio signals.

Correspondingly, the plurality of power drive circuits is configured to: perform power amplification on the M mixed audio signals based on respective output powers to obtain M power-amplified mixed audio signals, and then play the M power-amplified mixed audio signals by using the plurality of speakers.

In an example embodiment of the first aspect, the plurality of power drive circuits perform power amplification on the M mixed audio signals based on the respective output powers, and then the plurality of speakers play the M power-amplified mixed audio signals. Therefore, in the low-frequency and high-noise scenario, a low-frequency signal output capability of the headset can be improved, and low-frequency noise cancellation effect and low-frequency robustness of active noise cancellation can be further improved.

In an example embodiment, the active noise cancellation module includes a first audio mixing circuit, a second audio mixing circuit, and at least one feed-forward (FF) module. The at least one FF module is configured to obtain at least one feed-forward phase-inverted noise signal based on the at least one first ambient noise signal. The first audio mixing circuit is configured to perform audio mixing on the at least one feed-forward phase-inverted noise signal to obtain the feed-forward phase-inverted noise signal. The second audio mixing circuit is configured to separately perform audio mixing on the M downlink audio signals and the phase-inverted noise signal to obtain the M mixed audio signals. That is, the second audio mixing circuit is configured to perform audio mixing on each downlink audio signal and the phase-inverted noise signal to obtain the M mixed audio signals.

In an example embodiment, the headset further includes an error microphone. The active noise cancellation module further includes a third audio mixing circuit, M secondary path estimation (SPE) modules, and at least one feedback (feed-backward, FB) module. Input ends of the M SPE modules are configured to receive the M downlink audio signals, output ends of the M SPE modules are separately connected to an input end of the third audio mixing circuit, an output end of the third audio mixing circuit is connected to an input end of the at least one FB module, and an output end of the at least one FB module is connected to the first audio mixing circuit. The error microphone is configured to collect the mixed audio signal played by the plurality of speakers and a second ambient noise signal. The M SPE modules and the third audio mixing circuit are configured to obtain a feedback noise signal based on the mixed audio signal played by the plurality of speakers and the second ambient noise signal that are collected by the error microphone, and the M downlink audio signals. The at least one FB module is configured to obtain at least one feedback phase-inverted noise signal based on the feedback noise signal. The first audio mixing circuit is configured to perform audio mixing on the at least one feed-forward phase-inverted noise signal and the at least one feedback phase-inverted noise signal to obtain the phase-inverted noise signal.

Different from the first ambient noise signal, the second ambient noise signal is collected by the error microphone. Because locations of the error microphone and the reference microphone are different, the error microphone and the reference microphone separately collect ambient noise to obtain different ambient noise signals.

When the active noise cancellation module provides one phase-inverted noise signal by using a plurality of FF modules, a plurality of FB modules, or a plurality of FF modules and a plurality of FB modules, a plurality of paths of parallel ANC are formed. The plurality of paths of parallel ANC can further improve filtering fitting effect, thereby improving noise cancellation performance of the headset. In addition, filtering parameters of the plurality of paths of parallel ANC are properly set to implement frequency band-based fitting. This can improve robustness of active noise cancellation of the headset.

In an example embodiment, a quantity of the at least one phase-inverted noise signal is M. When M is greater than 1, the active noise cancellation module is configured to respectively perform audio mixing on the M downlink audio signals and the M phase-inverted noise signals to obtain M mixed audio signals.

For example, the M downlink audio signals and the M phase-inverted noise signals may be in a one-to-one correspondence. The active noise cancellation module is configured to respectively perform audio mixing on the M downlink audio signals and corresponding phase-inverted noise signals to obtain M mixed audio signals.

In an example embodiment of the first aspect, a plurality of phase-inverted noise signals are separately mixed with one of the M downlink audio signals to obtain the M mixed audio signals. The plurality of power drive circuits perform power amplification on one of the M mixed audio signals based on respective output powers, and then the corresponding speaker plays the power-amplified mixed audio signal. In this way, different mixed audio signals can be played by different speakers, and advantages of each speaker on different frequency bands are fully utilized, so that better noise cancellation effect of the headset can be achieved on different frequency bands.

In an example embodiment, the M phase-inverted noise signals include M feed-forward phase-inverted noise signals, and the active noise cancellation module includes M FF modules and M fourth audio mixing circuits. Each input end of the M FF modules is connected to the at least one reference microphone, and each output end of the M FF modules is connected to an input end of one of the M fourth audio mixing circuits. The M FF modules are configured to obtain the M feed-forward phase-inverted noise signals based on at least one first ambient noise signal. The M fourth audio mixing circuits are configured to perform audio mixing on the M downlink audio signals and corresponding feed-forward phase-inverted noise signals to obtain the M mixed audio signals.

Each fourth audio mixing circuit is configured to perform audio mixing on one of the M downlink audio signals and a corresponding feed-forward phase-inverted noise signal, to obtain a mixed audio signal output by the fourth audio mixing circuit. The corresponding feed-forward phase-inverted noise signal is a feed-forward phase-inverted noise signal output by the FF module connected to an input end of each fourth audio mixing circuit.

In an example embodiment, the headset further includes an error microphone. The active noise cancellation module further includes a third audio mixing circuit, M SPE modules, M FB modules, and M fifth audio mixing circuits. Input ends of the M SPE modules are configured to receive the M downlink audio signals, output ends of the M SPE modules are separately connected to an input end of the third audio mixing circuit, an output end of the third audio mixing circuit is connected to input ends of the M FB modules, and each output end of the M FB modules and each output end of the M FF modules are connected to an input end of a corresponding fifth audio mixing circuit. The error microphone is configured to collect the mixed audio signal played by the plurality of speakers and a second ambient noise signal. The M SPE modules and the third audio mixing circuit are configured to obtain a feedback noise signal based on the mixed audio signal played by the plurality of speakers and the second ambient noise signal that are collected by the error microphone, and the M downlink audio signals. The M FB modules are respectively configured to obtain M feedback phase-inverted noise signals based on the feedback noise signal. The M fifth audio mixing circuits are respectively configured to perform audio mixing on feed-forward phase-inverted noise signals of the corresponding FF modules and feedback phase-inverted noise signals of the corresponding FB modules to obtain the M phase-inverted noise signals. The M fourth audio mixing circuits are configured to perform audio mixing on the M downlink audio signals and corresponding phase-inverted noise signals to obtain one of the M mixed audio signals.

When the active noise cancellation module provides a plurality of phase-inverted noise signals by using a plurality of FF modules, a plurality of FB modules, or a plurality of FF modules and a plurality of FB modules, a plurality of paths of ANC are formed. The plurality of paths of ANC can further improve filtering fitting effect, thereby improving noise cancellation performance of the headset. For the plurality of paths of ANC, filtering parameters of the plurality of paths of ANC may be further properly set based on frequency characteristics of the plurality of speakers, to fully utilize advantages of different speakers on different frequency bands, and improve noise cancellation performance of the headset on the different frequency bands. In addition, filtering parameters of the plurality of paths of ANC are properly set to implement frequency band-based fitting. This can improve robustness of active noise cancellation of the headset.

For example, a combination of the plurality of speakers may be a low-frequency speaker and a high-frequency speaker, a low-frequency speaker and a full-frequency speaker, a high-frequency speaker and a full-frequency speaker, or the like.

In an example embodiment, when the active noise cancellation module includes a plurality of FF modules, filters included in the plurality of FF modules have different frequency characteristics.

In an example embodiment, when the active noise cancellation module includes a plurality of FB modules, filters included in the plurality of FB modules have different frequency characteristics.

Filter parameters of the filters included in the plurality of FF modules or the plurality of FB modules represent different frequency characteristics.

The frequency characteristic includes an amplitude-frequency characteristic or a phase-frequency characteristic corresponding to at least one frequency band range.

In an example embodiment, the filters included in the plurality of FF modules have different frequency ranges, or a same frequency range but different amplitude-frequency characteristics or phase-frequency characteristics corresponding to at least one frequency band range.

In an example embodiment, the filters included in the plurality of FB modules have different frequency ranges, or a same frequency range but different amplitude-frequency characteristics or phase-frequency characteristics corresponding to at least one frequency band range.

In an example embodiment, an amplitude-frequency characteristic, within at least one frequency band range, of a filter included in at least one of the plurality of FF modules or at least one of the plurality of FB modules is higher than an amplitude-frequency characteristic within a full frequency band range except the at least one frequency band range. That is, the filter included the FF module or the FB module may be a filter with the full frequency band range, and has good amplitude-frequency responses within some frequency band ranges.

In an example embodiment, the headset further includes a main control unit MCU. The main control unit MCU is configured to determine a parameter used by the active noise cancellation module.

In an example embodiment, the main control unit MCU is configured to: when at least one of acoustic environment information, ambient noise, or noise cancellation requirement information of a user changes, determine, from a plurality of groups of parameters based on the at least one of the acoustic environment information, the ambient noise, or the noise cancellation requirement information of the user, the parameter used by the active noise cancellation module.

The acoustic environment information indicates an acoustic environment formed by an ear canal of the user and the headset.

According to a second aspect, an embodiment of this application provides an active noise cancellation method. The method includes: obtaining at least one first ambient noise signal collected by at least one reference microphone; obtaining at least one phase-inverted noise signal based on the at least one first ambient noise signal; performing audio mixing on M downlink audio signals and the at least one phase-inverted noise signal to obtain at least one mixed audio signal; performing power amplification on the at least one mixed audio signal based on a plurality of output powers to obtain at least one power-amplified mixed audio signal; and playing the at least one power-amplified mixed audio signal by using a plurality of speakers.

In an example embodiment, a quantity of the at least one phase-inverted noise signal is one. The obtaining at least one phase-inverted noise signal based on the at least one first ambient noise signal includes: obtaining at least one feed-forward phase-inverted noise signal based on the at least one first ambient noise signal; and performing audio mixing on the at least one feed-forward phase-inverted noise signal to obtain one phase-inverted noise signal.

In an example embodiment, the method further includes: obtaining the mixed audio signal played by the plurality of speakers and a second ambient noise signal that are collected by an error microphone; obtaining a feedback noise signal based on the mixed audio signal played by the plurality of speakers and the second ambient noise signal that are collected by the error microphone, and the M downlink audio signals; and obtaining at least one feedback phase-inverted noise signal based on the feedback noise signal. The performing audio mixing on the at least one feed-forward phase-inverted noise signal to obtain one phase-inverted noise signal includes: performing audio mixing on the at least one feed-forward phase-inverted noise signal and the at least one feedback phase-inverted noise signal to obtain the phase-inverted noise signal.

In an example embodiment, a quantity of the at least one phase-inverted noise signal is M, and when M is greater than 1, the performing audio mixing processing on M downlink audio signals and the at least one phase-inverted noise signal to obtain at least one mixed audio signal includes: respectively performing audio mixing on the M downlink audio signals and corresponding phase-inverted noise signals to obtain M mixed audio signals.

In an example embodiment, the obtaining at least one phase-inverted noise signal based on the at least one first ambient noise signal includes: obtaining M feed-forward phase-inverted noise signals based on the at least one first ambient noise signal; and obtaining M phase-inverted noise signals based on the M feed-forward phase-inverted noise signals. Herein, in an example, the M feed-forward phase-inverted noise signals may be used as the M phase-inverted noise signals.

In an example embodiment, the method further includes: obtaining the mixed audio signal played by the plurality of speakers and a second ambient noise signal that are collected by an error microphone; obtaining a feedback noise signal based on the mixed audio signal played by the plurality of speakers and the second ambient noise signal that are collected by the error microphone, and the M downlink audio signals; and obtaining M feedback phase-inverted noise signals based on the feedback noise signal. The obtaining M phase-inverted noise signals based on the M feed-forward phase-inverted noise signals includes: respectively performing audio mixing on the M feedback phase-inverted noise signals and corresponding feed-forward phase-inverted noise signals to obtain the M phase-inverted noise signals.

In an example embodiment, the method further includes: when at least one of acoustic environment information, ambient noise, or noise cancellation requirement information of a user changes, determining, from a plurality of groups of parameters based on the at least one of the acoustic environment information, the ambient noise, or the noise cancellation requirement information of the user, a parameter used by an active noise cancellation module.

The acoustic environment information indicates an acoustic environment formed by an ear canal of the user and the headset, and the parameter used by the active noise cancellation module is used to generate the at least one phase-inverted noise signal.

According to a third aspect, an embodiment of this application provides an audio system with an active noise cancellation function. The audio system may include an electronic device and the headset according to any one of the first aspect or the possible embodiments of the first aspect, and the electronic device establishes a connection to the headset.

It should be understood that the technical solutions in the second aspect and the third aspect of this application are consistent with technical solutions in the first aspect of this application. Beneficial effects achieved by the various aspects and corresponding feasible implementations are similar.

BRIEF DESCRIPTION OF DRAWINGS

FIG. 17 is an equivalent schematic diagram of an example ANC architecture corresponding to FIG. 16 according to an embodiment of this application; and FIG. 18 is a schematic diagram of a procedure of an example active noise cancellation method according to an embodiment of this application.

DESCRIPTION OF EMBODIMENTS

Figure 1:
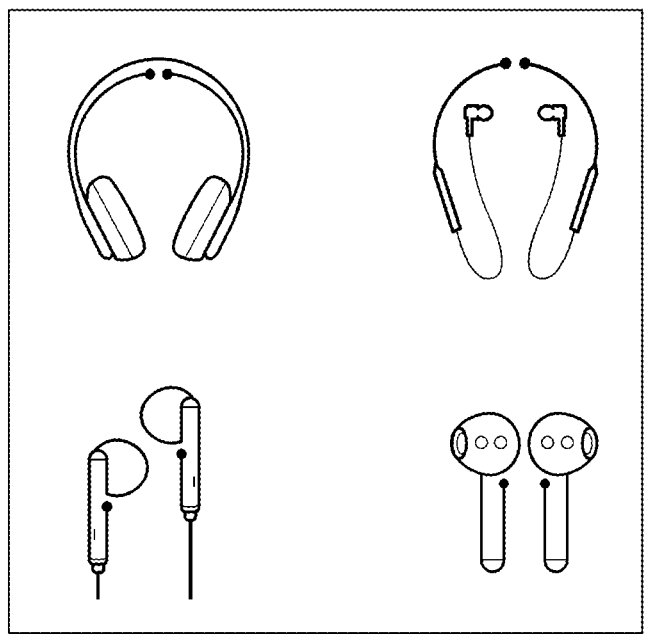
FIG. 1 is a schematic diagram of a specific form of an example headset with an active noise cancellation function according to an embodiment of this application.

The following describes in detail, with reference to the accompanying drawings, a headset with an active noise cancellation function and an active noise cancellation method that are provided in embodiments of this application.

In the specification and accompanying drawings of this application, the terms "first", "second", and the like are intended to distinguish between different objects or distinguish between different processing of a same object, but do not indicate a particular order of the objects.

In addition, the terms "including", "having", or any other variant thereof in descriptions of this application are intended to cover a non-exclusive inclusion. For example, a process, a method, a system, a product, or a device that includes a series of steps or units is not limited to the listed steps or units, but optionally further includes other unlisted steps or units, or optionally further includes another inherent step or unit of the process, the method, the product, or the device.

It should be noted that, in embodiments of this application, the word "example" or "for example" is used to represent giving an example, an illustration, or a description. Any embodiment or design scheme described as an "example" or "for example" in embodiments of this application should not be explained as being more preferred or having more advantages than another embodiment or design scheme. Exactly, use of the word "example", "for example", or the like is intended to present a related concept in a specific manner.

In the descriptions of this application, unless otherwise specified, "a plurality of" means two or more than two. A term "and/or" in this specification describes only an association relationship between associated objects and indicates that there may be any of three relationships. For example, A and/or B may represent any one of the following three cases: Only A exists, both A and B exist, or only B exists.

The headset with the active noise cancellation function in embodiments of this application may include a left earphone used with a left ear of a user and a right earphone used with a right ear of the user. The left earphone and the right earphone use an active noise cancellation module to implement active noise cancellation during audio playing. Specifically, the left earphone and the right earphone each generate, by using a digital-to-analog converter (DAC) and a power amplifier (PA) to drive a speaker of the earphone, an audio signal (namely, a phase-inverted noise signal) whose amplitude is equal to and phase is opposite to that of ambient noise, to cancel the ambient noise and reduce heard noise of a wearer. Because an output capability of each speaker of the left earphone and the right earphone is limited, when the phase-inverted noise signal played by the speaker is propagated to an eardrum of the user, low-frequency energy attenuation easily occurs, especially for a headset, for example, a semi-open headphone, an over-ear headphone, or an in-ear headphone with a small ear plug with leakage between the worn headset and the ear canal of the user. To reduce low-frequency noise in an environment, the active noise cancellation modules of the left earphone and the right earphone increase energy of low-frequency signals picked up by respective microphones, and then the low-frequency signals are sent by respective speakers. This active noise cancellation manner is feasible when low-frequency energy is small in an environment. However, when low-frequency energy in the ambient noise is extremely large (for example, a stable low-frequency and high-noise scenario such as public transportation or air travel, or a transient low-frequency and high-noise scenario such as a bus crossing a barrier, a train passing through a cave, or closing a door), because the low-frequency signal energy is excessively large, the low-frequency signal that is picked up by the microphone and that is increased by the active noise cancellation module exceeds a full amplitude, and consequently an exception such as pop noise occurs. To avoid the pop noise, the active noise cancellation module may be restrained from increasing a low frequency gain of the low-frequency signal picked up by the microphone. However, this reduces a low-frequency noise cancellation capability, and consequently, ambient noise cannot be canceled.

An embodiment of this application provides a headset with an active noise cancellation function. The headset with the active noise cancellation function may include the left earphone and the right earphone described above. The left earphone, the right earphone, or the left earphone and the right earphone each may include an active noise cancellation module, a plurality of speakers, a plurality of power drive circuits, and at least one reference microphone. An audio signal output capability of the headset is improved by using the plurality of power drive circuits to drive the plurality of speakers. This helps improve a noise cancellation capability of the headset and robustness of the headset in a low-frequency and high-noise scenario and avoid the pop noise.

Compared with one PA, in this embodiment, the plurality of power drive circuits can provide a higher output power. In the low-frequency and high-noise scenario, the headset can provide a higher low-frequency capability and low-frequency sensitivity, so that the headset has a higher low-frequency output capability, thereby implementing better low-frequency noise cancellation effect in the low-frequency and high-noise scenario. In addition, because an audio signal output capability of the headset is higher, a low frequency gain of the active noise cancellation module may be lower. Therefore, in the low-frequency and high-noise scenario, when a low-frequency signal picked up by a microphone passes through the active noise cancellation module, pop noise caused by clipping and the like can be avoided. In this way, the headset in this embodiment can have better low-frequency robustness.

For a specific implementation, refer to the explanation and description of the following embodiments.

A specific form of the headset with the active noise cancellation function may be an over-ear headphone, an in-ear earphone, a semi-open earphone, or the like. The over-ear headphone may include earphones of different forms such as an earmuff headphone or an on-ear headphone. For example, FIG. 1 is a schematic diagram of an example headset with an active noise cancellation function according to an embodiment of this application. As shown in FIG. 1, the headset with the active noise cancellation function in this embodiment may be in any specific form shown in FIG. 1. Certainly, it may be understood that the headset may be in another existing headset form or a future headset form. This embodiment is not limited to the specific form of the headset.

The headset with the active noise cancellation function may be used with an electronic device such as a mobile phone, a notebook computer, or a watch, to process audio services such as media and call services and some other data services of the electronic device. For example, the audio services may include media services such as playing music, recording, a sound in a video file, background music in a game, or an incoming call prompt tone for a user, and may further include playing, in a call service scenario such as a phone call, a voice message in an instant messaging application, an audio call, a video call, a game, or a voice assistant, voice data of a peer end for the user, collecting voice data of the user and sending the voice data to the peer end, or the like. A connection manner between the headset with the active noise cancellation function and an electronic device such as a mobile phone, a notebook computer, or a watch may be a wired connection, or may be a wireless connection.

Figure 2:
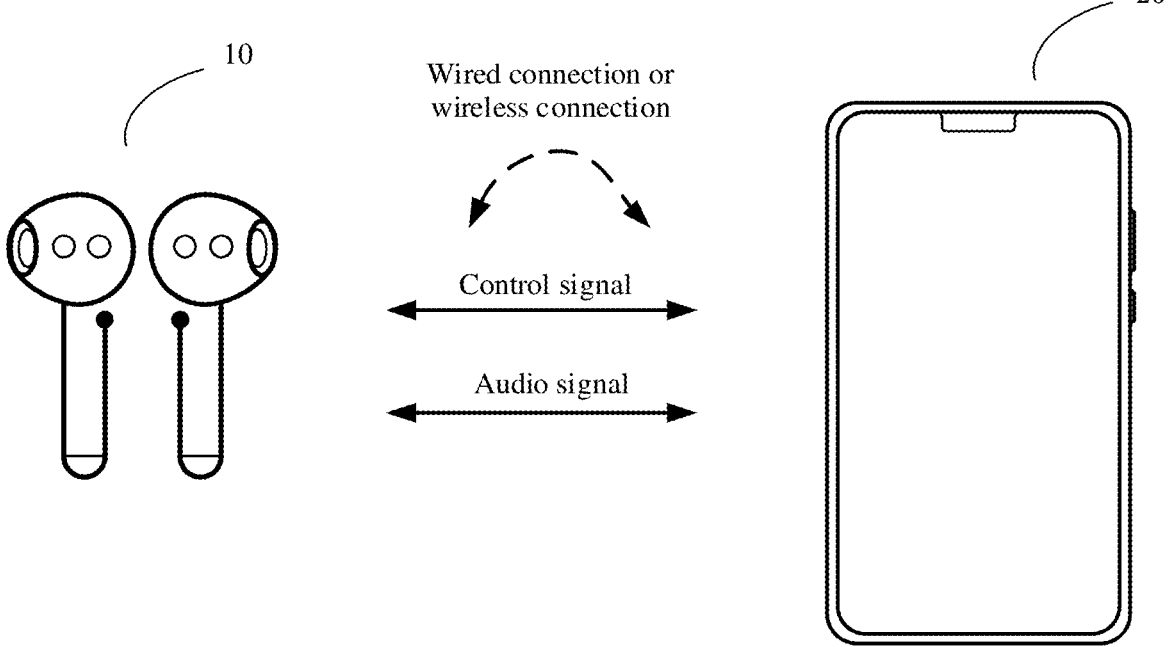
FIG. 2 shows an example audio system with an active noise cancellation function according to an embodiment of this application.

For example, FIG. 2 shows an example audio system with an active noise cancellation function according to an embodiment of this application. As shown in FIG. 2, the audio system may include a headset 10 with an active noise cancellation function and an electronic device 20. For a specific structure of the headset 10 with an active noise cancellation function, refer to the explanation and description of the following embodiments. The electronic device 20 is configured to control the headset 10, transmit an audio signal, and the like.

The headset 10 may establish a communication connection to the electronic device 20 in a wired or wireless manner. For example, a wired connection may be established to the electronic device 20 through a line and a headset jack. The headset jack is configured to connect to a wired headset. The headset jack may be a USB interface 130, or may be a 3.5 mm open mobile terminal platform (OMTP) standard interface or a cellular telecommunications industry association of the USA (CTIA) standard interface. For another example, the headset 10 may also establish a wireless connection to the electronic device 20 by using a wireless communication module (for example, Bluetooth or WLAN).

For example, the electronic device 20 may be, for example, a mobile phone, a tablet computer, a personal computer (PC), a personal digital assistant (PDA), a netbook, a wearable electronic device (for example, a smartwatch, a smart band, or smart glasses), an augmented reality (AR) device, a virtual reality (VR) device, a vehicle-mounted device, a smart car, or a robot. A specific form of the electronic device 20 is not specially limited in embodiments of this application.

In this embodiment, the audio system with the active noise cancellation function helps improve noise cancellation performance and avoid pop noise, thereby improving user experience of playing an audio by using the audio system.

The following uses several specific embodiments to specifically explain and describe the headset with the active noise cancellation function in embodiments of this application.

Figure 3:
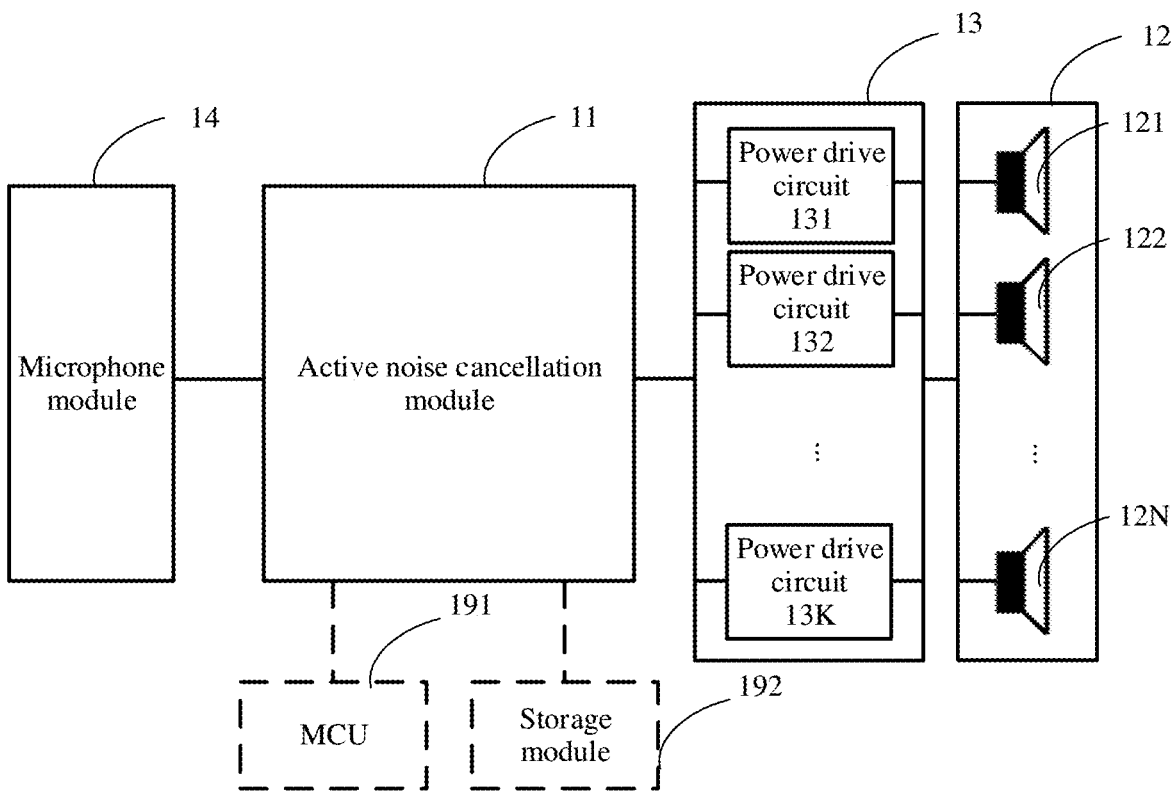
FIG. 3 is a schematic diagram of an example headset with an active noise cancellation function according to an embodiment of this application.

FIG. 3 is a schematic diagram of an example headset with an active noise cancellation function according to an embodiment of this application. As shown in FIG. 3, the headset 10 with an active noise cancellation function provided in this embodiment may include an active noise cancellation module 11, a speaker module 12, a power drive module 13, and a microphone module 14.

The speaker module 12 may include a plurality of speakers (121, 122, . . . , 12N). The power drive module 13 may include a plurality of power drive circuits (131, 132, . . . , 13K). The microphone module 14 may include one or more microphones. N is any positive integer greater than 1, and K is any positive integer greater than 1.

An output end of any one of the plurality of power drive circuits (131, 132, . . . , 13K) is connected to at least one of the plurality of speakers (121, 122, . . . , 12N), and the active noise cancellation module 11 is connected between one or more microphones and input ends of the plurality of power drive circuits (131, 132, . . . , 13K).

In a possible implementation, N=K, to be specific, an output end of each of the plurality of power drive circuits (131, 132, . . . , 13K) is connected to one of the plurality of speakers (121, 122, . . . , 12N). That is, one power drive circuit is connected to one speaker. The two are in a one-to-one correspondence.

In another possible implementation, K<N, to be specific, an output end of at least one of the plurality of power drive circuits (131, 132, . . . , 13K) is connected to two of the plurality of speakers (121, 122, . . . , 12N). In other words, in the headset with the active noise cancellation function, there is one power drive circuit connected to one speaker, and there is also one power drive circuit connected to two speakers. The two may be in a one-to-one correspondence, or may be in a one-to-multiple relationship.

One or more microphones, also referred to as "mikes" and "mics", are separately configured to convert a voice signal into an electrical signal. Specifically, the one or more microphones may include one or more reference microphones (reference mics). The one or more reference microphones are configured to collect an external noise signal, to be specific, collect a first ambient noise signal, and provide the first ambient noise signal to the active noise cancellation module 11, to implement an active noise cancellation (ANC) function. Optionally, the one or more microphones may further include an error microphone (error mic). The error microphone is configured to collect a noise signal in an ear canal of the user, that is, collect a second ambient noise signal.

The active noise cancellation module 11 is configured to obtain one or more phase-inverted noise signals based on the first ambient noise signal collected by the one or more reference microphones, where the one or more phase-inverted noise signals are used to partially or totally cancel the ambient noise. The active noise cancellation module 11 is further configured to perform audio mixing on the M downlink audio signals and the one or more phase-inverted noise signals to obtain one or more mixed audio signals. Mis any positive integer. The M downlink audio signals come from an electronic device connected to the headset. For example, the M downlink audio signals come from a mobile phone connected to the headset, and the connection may be a wired connection or a wireless connection.

The plurality of power drive circuits (131, 132, . . . , 13K) are configured to: perform power amplification on the one or more mixed audio signals based on respective output powers to obtain one or more power-amplified mixed audio signals, and play the one or more power-amplified mixed audio signals by using the plurality of speakers (121, 122, . . . , 12N).

Any one of the plurality of power drive circuits (131, 132, . . . , 13K) may include a digital-to-analog converter (digital analogue converter, DAC) and a power amplifier (PA). An input end of the DAC is connected to an output end of the active noise cancellation module 11. An output end of the DAC is connected to an input end of the PA, and an output end of the PA is connected to input ends of one or more speakers.

Optionally, as shown by a dashed line in FIG. 3, the headset with the active noise cancellation function in this embodiment may further include a micro control unit (MCU) 191. The MCU 191 is configured to control, configure, or modify a parameter in the active noise cancellation module 11. The parameter may be a filter parameter or the like.

In some embodiments, the headset with the active noise cancellation function in this embodiment may further include a storage module 192. The storage module 192 may store a plurality of groups of parameters, namely, a plurality of groups of parameters used by active noise cancellation module 11, for example, a plurality of groups of filter parameters.

According to the headset with the active noise cancellation function in this embodiment, the plurality of power drive circuits drive the plurality of speakers to play the phase-inverted noise signal and the downlink audio signal. In this way, more output powers can be used to provide higher output energy for the headset, to improve noise cancellation performance of the headset. When the headset is used to play an audio in a low-frequency and high-noise scenario, the headset has a high low-frequency output capability, thereby helping improve noise cancellation effect of the headset in the low-frequency and high-noise scenario. In addition, because an audio signal output capability of the headset is higher, a low-frequency gain of the active noise cancellation module may be lower. Therefore, in the low-frequency and high-noise scenario, when a low-frequency signal picked up by the microphone passes through the active noise cancellation module, pop noise can be avoided. This can improve low-frequency robustness of active noise cancellation. The low-frequency and high-noise scenario may include a stable low-frequency and high-noise scenario and a transient low-frequency and high-noise scenario. For example, the stable low-frequency and high-noise scenario may be a scenario such as public transportation or air travel. The transient low-frequency and high-noise scenario may be a scenario such as a bus crossing a barrier, a train passing through a cave, or closing a door.

The headset with the active noise cancellation function shown in FIG. 3 may have different implementable structures, to implement good noise cancellation effect in the low-frequency and high-noise scenario.

In an implementation, there is one phase-inverted noise signal. To be specific, the active noise cancellation module 11 provides one phase-inverted noise signal for audio mixing with the M downlink audio signals. Correspondingly, the active noise cancellation module 11 is configured to perform audio mixing on the M downlink audio signals and the phase-inverted noise signal to obtain M mixed audio signals. The plurality of power drive circuits (131, 132, . . . , 13K) are configured to: perform power amplification on the M mixed audio signals based on respective output powers, and then play M power-amplified mixed audio signals by using the plurality of speakers.

For the active noise cancellation module 11 providing one phase-inverted noise signal, the active noise cancellation module 11 may include a first audio mixing circuit, a second audio mixing circuit, and one or more feed-forward (FF) modules. The one or more FF modules are configured to obtain one or more feed-forward phase-inverted noise signals based on one or more first ambient noise signals. The first audio mixing circuit is configured to perform audio mixing on the one or more feed-forward phase-inverted noise signals to obtain one phase-inverted noise signal. The second audio mixing circuit is configured to separately perform audio mixing on the M downlink audio signals and the phase-inverted noise signal to obtain the M mixed audio signals.

In some embodiments, the headset with the active noise cancellation function in this embodiment may further include the error microphone. The error microphone may provide the collected audio signal in the ear canal of the user to the active noise cancellation module 11. The audio signal in the ear canal of the user may include the mixed audio signal played by one or more speakers, and an ambient noise signal (namely, the second ambient noise signal) in the ear canal. Correspondingly, the active noise cancellation module 11 may further include a third audio mixing circuit, M secondary path estimation (SPE) modules, and at least one feedback (feed-backward, FB) module. Input ends of the M SPE modules are configured to receive the M downlink audio signals. Output ends of the M SPE modules are separately connected to an input end of the third audio mixing circuit, an output end of the third audio mixing circuit is connected to an input end of the at least one FB module, and an output end of the at least one FB module is connected to the first audio mixing circuit.

The error microphone is configured to collect the mixed audio signal played by the plurality of speakers and the second ambient noise signal. The M SPE modules and the third audio mixing circuit are configured to obtain a feedback noise signal based on the mixed audio signal played by the plurality of speakers and the second ambient noise signal that are collected by the error microphone, and the M downlink audio signals. The at least one FB module is configured to obtain at least one feedback phase-inverted noise signal based on the feedback noise signal. The first audio mixing circuit is configured to perform audio mixing on the at least one feed-forward phase-inverted noise signal and the at least one feedback phase-inverted noise signal to obtain the phase-inverted noise signal.

A headset structure in which the active noise cancellation module 11 provides one phase-inverted noise signal for audio mixing with the M downlink audio signals may also be referred to as a single-ANC structure or a parallel-ANC structure. The active noise cancellation module 11 in the single-ANC structure may include one FF module, one FF module and one FB module, or one FB module. The active noise cancellation module 11 in the parallel-ANC structure may include a plurality of FF modules, a plurality of FF modules and one FB module, a plurality of FB modules, a plurality of FB modules and one FF module, or a plurality of FB modules and a plurality of FF modules. This may be properly set based on a requirement.

When the active noise cancellation module 11 includes a plurality of FF modules, frequency ranges of filters included in the plurality of FF modules may be the same or may be different. When the active noise cancellation module 11 includes a plurality of FB modules, frequency ranges of filters included in the plurality of FB modules may be the same or may be different.

In some embodiments, filter parameters of filters included in the plurality of FF modules or the plurality of FB modules may represent different frequency characteristics. The frequency characteristic may include an amplitude-frequency characteristic or a phase-frequency characteristic corresponding to at least one frequency band range. For example, an amplitude-frequency characteristic, within at least one frequency band range, of a filter included in at least one of the plurality of FF modules or at least one of the plurality of FB modules is higher than an amplitude-frequency characteristic within a full frequency band range except the at least one frequency band range.

Figure 4:
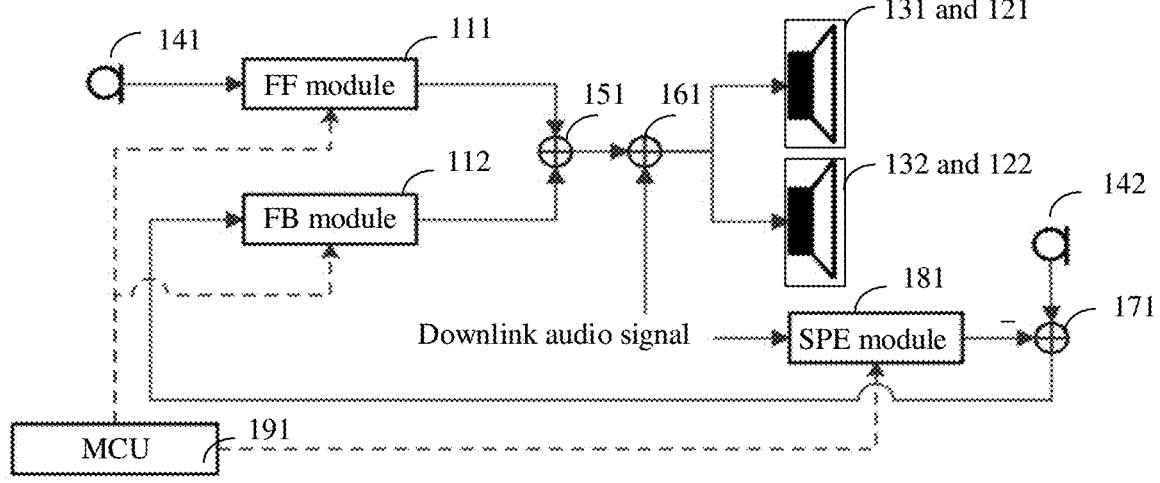
FIG. 4 is a schematic diagram of an example headset with an active noise cancellation function according to an embodiment of this application.

For example, the description is provided by using an example in which the headset with the active noise cancellation function includes one reference microphone, two (N=2) speakers, and two (K=2) power drive circuits. FIG. 4 is an example schematic diagram of the headset with the active noise cancellation function according to an embodiment of this application. As shown in FIG. 4, the active noise cancellation module 11 in the headset with the active noise cancellation function provided in this embodiment may include an FF module 111 and an FB module 112. A first audio mixing circuit includes an audio mixer 151. A second audio mixing circuit includes an audio mixer 161. A third audio mixing circuit includes an audio mixer 171. In this embodiment, one reference microphone 141, one error microphone 142, and one (M=1) SPE module 181 are used as an example. As shown in FIG. 4, an output end of the reference microphone 141 is connected to an input end of the FF module 111, and an output end of the error microphone 142 and an output end of the SPE module 181 are separately connected to the audio mixer 171. An input end of the SPE module is configured to receive a downlink audio signal. An output end of the audio mixer 171 is connected to an input end of the FB module 112, and an output end of the FB module 112 and an output end of the FF module are separately connected to an input end of the audio mixer 151. An output end of the audio mixer 151 is connected to one input end of the audio mixer 161, and the audio mixer 161 further includes the other input end, configured to receive a downlink audio signal. An output end of the audio mixer 161 is separately connected to respective input ends of a power drive circuit 131 and a power drive circuit 132, an output end of the power drive circuit 131 is connected to an input end of a speaker 121, and an output end of the power drive circuit 132 is connected to an input end of a speaker 122. For ease of illustration, the power drive circuit and the speaker are directly combined, and a speaker with a peripheral rectangular frame represents the power drive circuit and the speaker, for example, the power drive circuit 131 and the speaker 121, and the power drive circuit 132 and the speaker 122 shown in FIG. 4.

The headset with the active noise cancellation function shown in FIG. 4 may further include the micro control unit (MCU) 191. The MCU 191 is configured to control, configure, or modify parameters in the FF module 111, the FB module 112, and the SPE module 181. The parameter may be a filter parameter or the like.

A working principle of the headset with the active noise cancellation function shown in FIG. 4 is as follows: The error microphone 142 collects mixed audio signals played by the speaker 121 and the speaker 122, and a second ambient noise signal. The SPE module 181 and the audio mixer 171 are configured to subtract M downlink audio signals from audio signals (including the mixed audio signals played by the speaker 121 and the speaker 122, and the second ambient noise signal) collected by the error microphone 142, to obtain a feedback noise signal. The FB module 112 is configured to obtain a feedback phase-inverted noise signal based on the feedback noise signal. The reference microphone 141 collects a first ambient noise signal, and the FF module 111 is configured to obtain a feed-forward phase-inverted noise signal based on the first ambient noise signal collected by the reference microphone 141. The audio mixer 151 performs audio mixing on the feedback phase-inverted noise signal and the feed-forward phase-inverted noise signal to obtain a phase-inverted noise signal. The audio mixer 161 performs audio mixing on the phase-inverted noise signal and the downlink audio signal to obtain a mixed audio signal. The audio mixer 161 separately provides the mixed audio signal to the power drive circuit 131 and the power drive circuit 132. The power drive circuit 131 performs power amplification on the mixed audio signal, and drives the speaker 121 to play a power-amplified mixed audio signal. The power drive circuit 132 performs power amplification on the mixed audio signal, and drives the speaker 122 to play a power-amplified mixed audio signal. The phase-inverted noise signal in the power-amplified mixed audio signal is used to cancel or partially cancel ambient noise, to achieve noise cancellation effect.

The FF module 111, the FB module 112, and the SPE module 181 each may include a gain module, a filter module, and a limiter module. The filter module may be a biquad digital filter, an infinite impulse response (IIR) filter, a finite impulse response (FIR) filter, or the like. A Z-transform transfer function formula (1) of the biquad filter is shown as follows. Parameters of the biquad filter are easy to debug, and a structure of the biquad filter is suitable for software and hardware implementation. The biquad filter is one of common filters in ANC.

$$H(z) = \frac{b_0 + b_1 z^{-1} + b_2 z^{-2}}{1 + a_1 z^{-1} + a_2 z^{-2}} \tag{1}$$

The limiter module is a limiting module for preventing signal overflow. The limiter module can limit an amplitude of an output signal within a specific range. For example, the limiter module may limit the output signal within a defined threshold level through dynamic gain control. The principle may be briefly described as follows: output=gain*input. When a value of an input signal exceeds a specified threshold, a gain value quickly decreases from 1, so that the value of the output signal is restored to a value below the threshold. After the value of the input signal falls below the threshold, the gain value is gradually restored to 1 until the input signal is not suppressed by the gain. Through sample-level real-time monitoring of the signal and continuous adjustment of the gain value, the output signal falls within a threshold range, and smoothness of the signal is ensured.

The headset shown in FIG. 4 uses an ANC structure in which two power drive circuits drive double loudspeakers, and higher low-frequency energy and low-frequency sensitivity are provided, by using a double output power, for the headset to play the phase-inverted noise signal. Therefore, the headset has a higher low-frequency output capability, and further brings better low-frequency noise cancellation effect.

In addition, because an output capability of the headset is higher, low-frequency gains corresponding to the FF module and the FB module may be lower. When a low-frequency and high-noise signal passes through the FF module and the FB module, pop noise caused by clipping or the like is not likely to occur. The ANC structure has better low-frequency robustness.

Figures 5, 6:
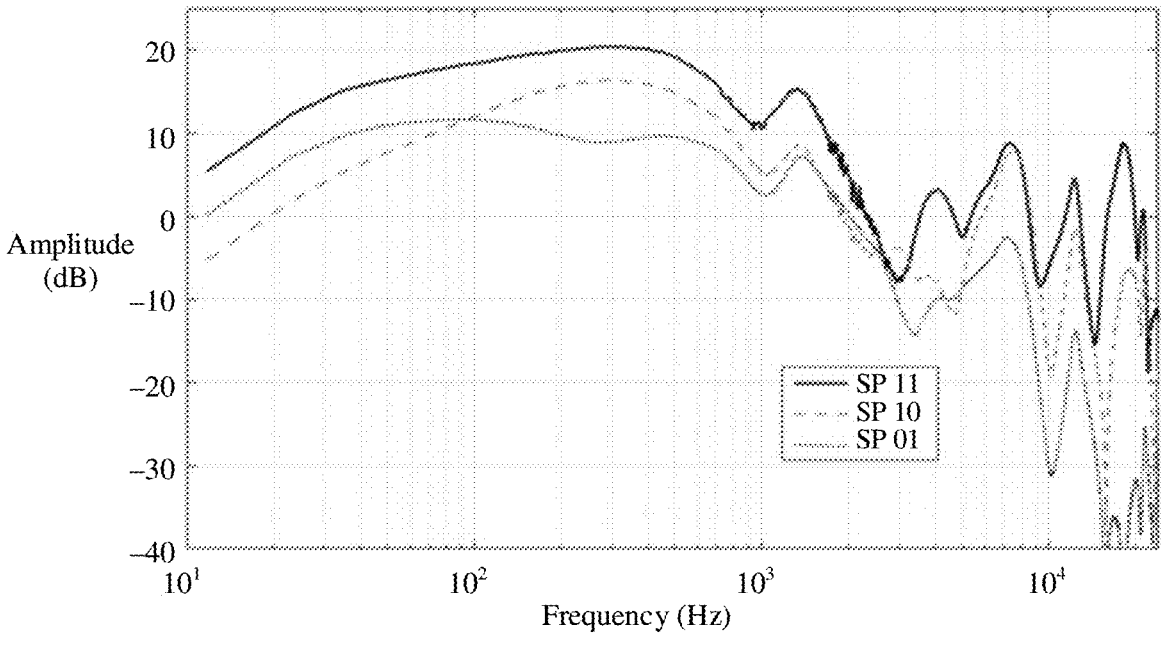
FIG. 5 is a diagram of a secondary path (SP) response corresponding to the headset shown in FIG. 4 according to an embodiment of this application.
FIG. 6 is an example diagram of comparison of noise cancellation curves of ANC obtained when different speakers work according to an embodiment of this application.

For example, FIG. 5 is a diagram of an example secondary path (SP) response corresponding to the headset shown in FIG. 4 according to an embodiment of this application. A secondary path is a transfer function from the speaker of the headset to the error microphone. As shown in FIG. 5, an SP 11 represents a path response of a headset signal (namely, the power-amplified mixed audio signal) that is propagated to the error microphone after passing through both the speaker 121 and the speaker 122. An SP 10 represents a path response of the headset signal that is propagated to the error microphone by using only the speaker 121. An SP 01 represents a path response of the headset signal that is propagated to the error microphone by using only the speaker 122. It can be seen from FIG. 5 that the SP 11 has a higher low-frequency response gain than the SP 10 and SP 01.

For wearing comfort, the headset and human ears are not totally sealed, and leakage occurs. The leakage causes an SP frequency response of the headset to attenuate at a low frequency, and the low-frequency output capability of the headset is insufficient. The two power drive circuits in this embodiment each drive a speaker, so that a low-frequency gain brought by the SP 11 can improve noise cancellation effect in the low-frequency and high-noise scenario.

Figure 7:
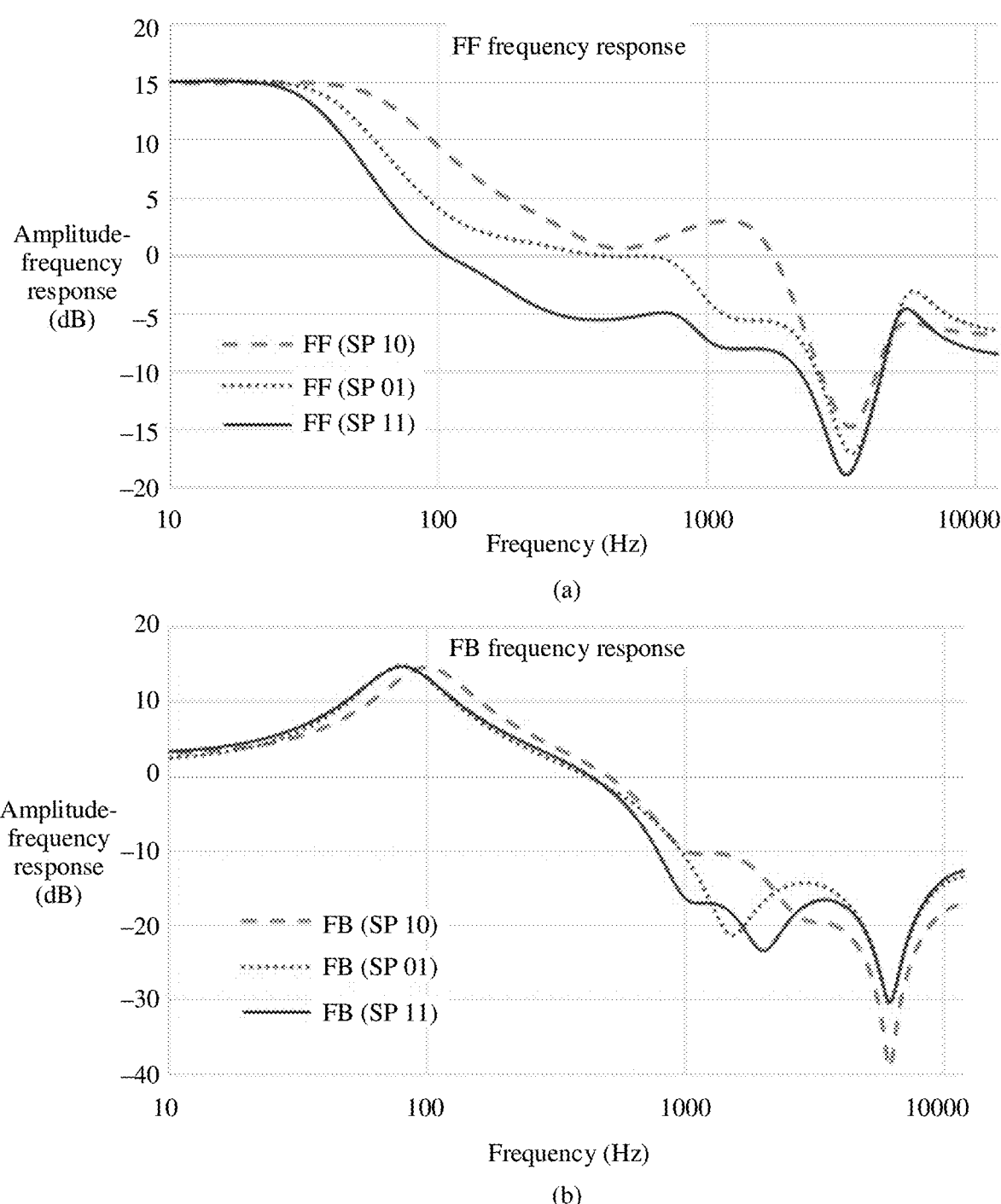
FIG. 7 is an example diagram of comparison of FF and FB frequency response curves obtained when different speakers work according to an embodiment of this application.

FIG. 6 is an example diagram of comparison of noise cancellation curves of ANC obtained when different speakers work according to an embodiment of this application. FIG. 7 is an example diagram of comparison of FF and FB frequency response curves obtained when different speakers work according to an embodiment of this application. ANC parameters are separately optimized based on the SP 11 (both the speaker 121 and the speaker 122 work), the SP 10 (only the speaker 121 works), and the SP 01 (only the speaker 122 works), to obtain active noise cancellation effect comparison curves shown in FIG. 6, and obtain filter response curves corresponding to the FF module and the FB module shown in (a) and (b) in FIG. 7. It can be seen from the noise cancellation curves that low-frequency noise cancellation effect corresponding to the SP 11 is significantly better than that corresponding to the SP 10 or SP 01. This indicates that a low-frequency output capability corresponding to the SP 11 obtained when two speakers are used is higher than that obtained when only one of the speakers is used. This brings better low-frequency noise cancellation effect. A frequency response gain, corresponding to the FF module, obtained through optimization based on the SP 11 is lower at a low frequency, and robustness in a low-frequency noise environment is higher. For example, when the low-frequency and high-noise scenario occurs, for example, the bus crossing the barrier or closing the door, the low-frequency and high-noise signal is picked up by the microphone, and then processed by filters in the FF module and the FB module. If a filter gain is higher, noise such as pop is more likely to occur. However, the FF module obtained through optimization based on the SP 11 can avoid the noise such as the pop.

According to the headset with the active noise cancellation function in this embodiment, the two power drive circuits each drive one speaker to play the phase-inverted noise signal and the downlink audio signal. In this way, higher output energy can be provided for the headset, to improve noise cancellation performance of the headset. When the headset is used to play an audio in the low-frequency and high-noise scenario, the headset has a high low-frequency output capability and high low-frequency sensitivity, thereby helping improve noise cancellation effect of the headset in the low-frequency and high-noise scenario and robustness of active noise cancellation and avoiding pop noise.

Figure 8:
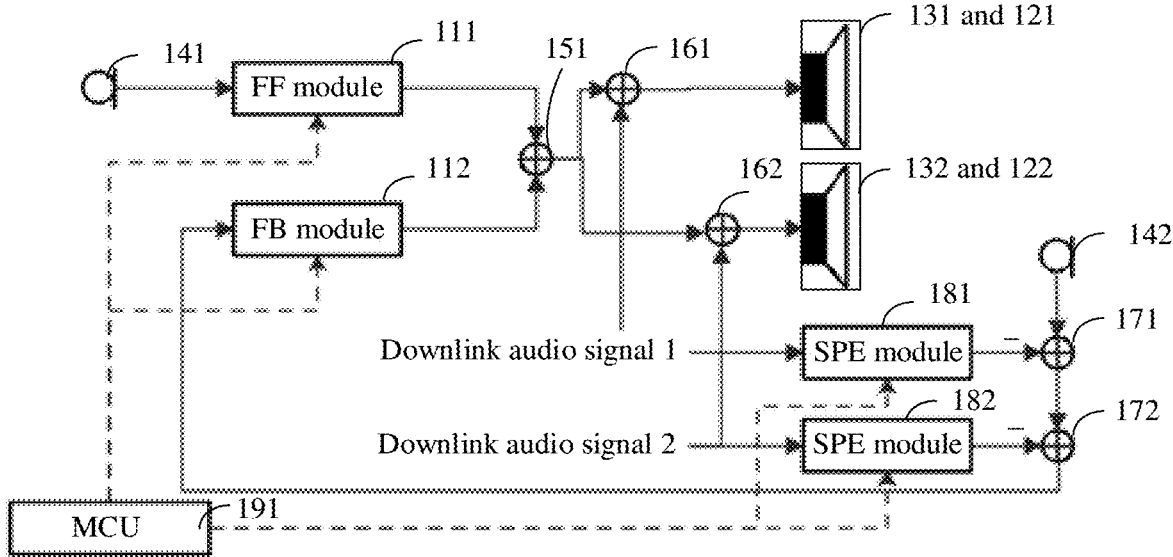
FIG. 8 is a schematic diagram of an example headset with an active noise cancellation function according to an embodiment of this application.

For example, based on the embodiment shown in FIG. 4, when there are two downlink audio signals, an embodiment of this application may further provide a headset structure shown in FIG. 8. FIG. 8 is an example schematic diagram of the headset with the active noise cancellation function according to an embodiment of this application. As shown in FIG. 8, the second audio mixing circuit in the headset with the active noise cancellation function provided in this embodiment includes the audio mixer 161 and the audio mixer 162. The third audio mixing circuit includes the audio mixer 171 and the audio mixer 172. The headset includes two (M=2) SPE modules, namely the SPE module 181 and the SPE module 182. As shown in FIG. 8, an output end of the reference microphone 141 is connected to an input end of the FF module 111, and an output end of the error microphone 142 and an output end of the SPE module 181 are separately connected to the audio mixer 171. An input end of the SPE module 181 is configured to receive a downlink audio signal 1. An output end of the audio mixer 171 and an output end of the SPE module 182 are separately connected to an input end of the audio mixer 172, and the input end of the SPE module 182 is configured to receive a downlink audio signal 2. An output end of the audio mixer 172 is connected to an input end of the FB module 112, and an output end of the FB module 112 and an output end of the FF module are separately connected to an input end of the audio mixer 151. An output end of the audio mixer 151 is separately connected to one input end of the audio mixer 161 and one input end of the audio mixer 162. The audio mixer 161 further includes the other input end, configured to receive the downlink audio signal 1. An output end of the audio mixer 161 is connected to an input end of the power drive circuit 131, and an output end of the power drive circuit 131 is connected to an input end of the speaker 121. The audio mixer 162 further includes the other input end, configured to receive the downlink audio signal 2. An output end of the audio mixer 162 is connected to an input end of the power drive circuit 132, and the output end of the power drive circuit 132 is connected to an input end of the speaker 122.

A working principle of the headset with the active noise cancellation function shown in FIG. 8 is as follows: The error microphone 142 collects the downlink audio signal 1 played by the speaker 121, the downlink audio signal 2 played by the speaker 122, and a second ambient noise signal. The SPE module 181, the SPE module 182, the audio mixer 171, and the audio mixer 172 are configured to subtract the downlink audio signal 1 and the downlink audio signal 2 from audio signals (including the downlink audio signal 1 played by the speaker 121, the downlink audio signal 2 played by the speaker 122, and the second ambient noise signal) collected by the error microphone 142, to obtain a feedback noise signal. The FB module 112 is configured to obtain a feedback phase-inverted noise signal based on the feedback noise signal. The reference microphone 141 collects a first ambient noise signal, and the FF module 111 is configured to obtain a feed-forward phase-inverted noise signal based on the first ambient noise signal collected by the reference microphone 141. The audio mixer 151 performs audio mixing on the feedback phase-inverted noise signal and the feed-forward phase-inverted noise signal to obtain a phase-inverted noise signal. The audio mixer 161 performs audio mixing on the phase-inverted noise signal and the downlink audio signal 1 to obtain a mixed audio signal 1. The audio mixer 161 provides the mixed audio signal 1 to the power drive circuit 131. The power drive circuit 131 performs power amplification on the mixed audio signal 1, and drives the speaker 121 to play a power-amplified mixed audio signal 1. The audio mixer 162 performs audio mixing on the phase-inverted noise signal and the downlink audio signal 2 to obtain a mixed audio signal 2. The audio mixer 162 provides the mixed audio signal 2 to the power drive circuit 132. The power drive circuit 132 performs power amplification on the mixed audio signal 2, and drives the speaker 122 to play a power-amplified mixed audio signal. Phase-inverted noise signals in the power-amplified mixed audio signal 1 and the power-amplified mixed audio signal 2 are used to cancel or partially cancel the ambient noise, to achieve noise cancellation effect.

Figure 9:
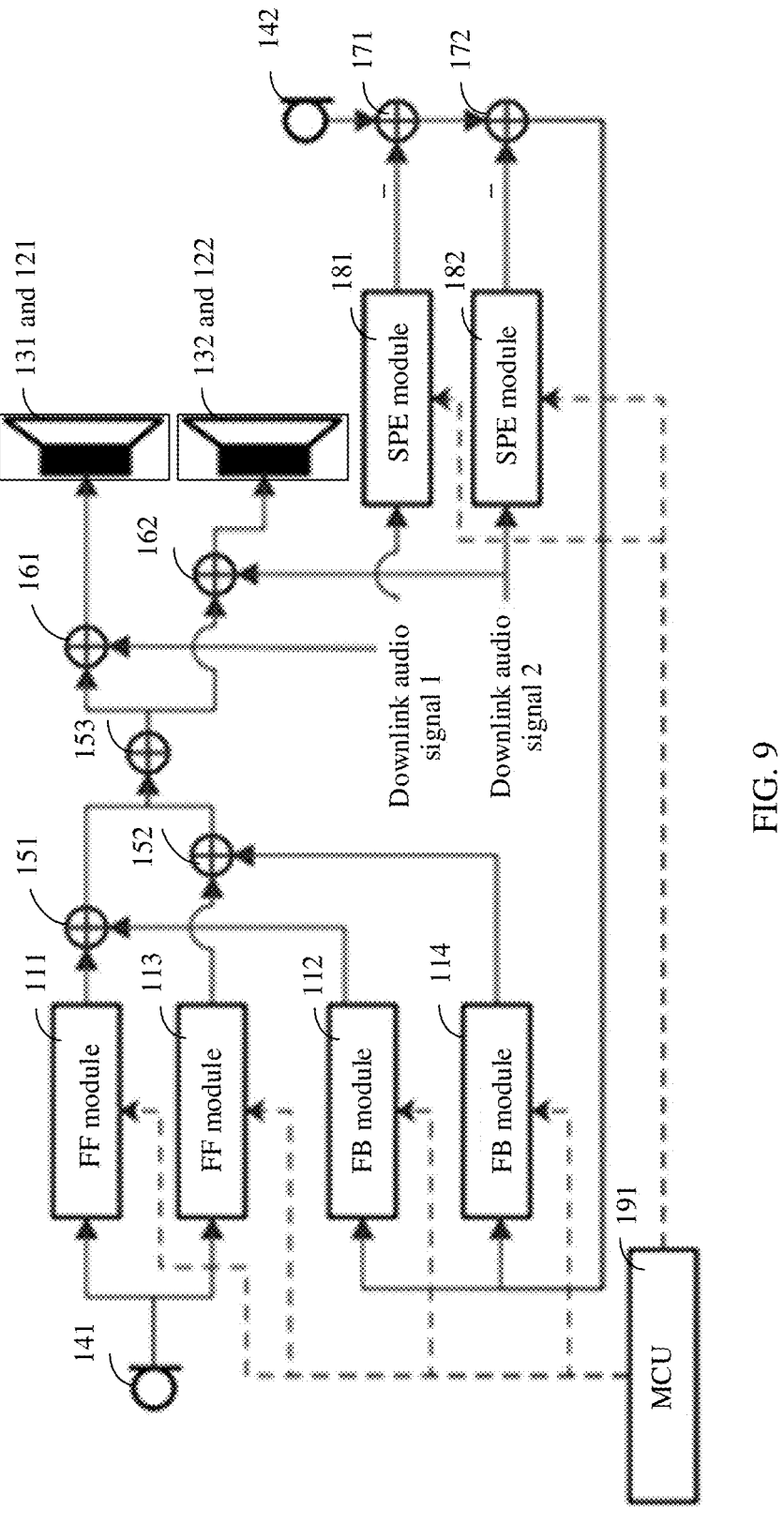
FIG. 9 is a schematic diagram of an example headset with an active noise cancellation function according to an embodiment of this application.

For example, when there are two downlink audio signals, an embodiment of this application may further provide a headset structure shown in FIG. 9. FIG. 9 is an example schematic diagram of the headset with the active noise cancellation function according to an embodiment of this application. As shown in FIG. 9, the active noise cancellation module 11 in the headset with the active noise cancellation function provided in this embodiment may include the FF module 111, the FF module 113, the FB module 112, and the FB module 114. The first audio mixing circuit includes the audio mixer 151, the audio mixer 152, and the audio mixer 153. The second audio mixing circuit includes the audio mixer 161 and the audio mixer 162. The third audio mixing circuit includes the audio mixer 171 and the audio mixer 172. The headset includes two (M=2) SPE modules, namely the SPE module 181 and the SPE module 182. As shown in FIG. 9, an output end of the reference microphone 141 is separately connected to respective input ends of the FF module 111 and the FF module 113, and an output end of the error microphone 142 and an output end of the SPE module 181 are separately connected to the audio mixer 171. An input end of the SPE module 181 is configured to receive a downlink audio signal 1. An output end of the audio mixer 171 and an output end of the SPE module 182 are separately connected to an input end of the audio mixer 172, and the input end of the SPE module 182 is configured to receive a downlink audio signal 2. An output end of the audio mixer 172 is separately connected to respective input ends of the FB module 112 and the FB module 114, and an output end of the FB module 112 and an output end of the FF module 111 are separately connected to an input end of the audio mixer 151. An output end of the FB module 114 and an output end of the FF module 113 are separately connected to an input end of the audio mixer 152. An output end of the audio mixer 151 and an output end of the audio mixer 152 are respectively connected to an input end of the audio mixer 153. An output end of the audio mixer 153 is separately connected to one input end of the audio mixer 161 and one input end of the audio mixer 162. The audio mixer 161 further includes the other input end, configured to receive the downlink audio signal 1. An output end of the audio mixer 161 is connected to an input end of the power drive circuit 131, and an output end of the power drive circuit 131 is connected to an input end of the speaker 121. The audio mixer 162 further includes the other input end, configured to receive the downlink audio signal 2. An output end of the audio mixer 162 is connected to an input end of the power drive circuit 132, and the output end of the power drive circuit 132 is connected to an input end of the speaker 122.

A working principle of the headset with the active noise cancellation function shown in FIG. 9 is as follows: The error microphone 142 collects the downlink audio signal 1 played by the speaker 121, the downlink audio signal 2 played by the speaker 122, and a second ambient noise signal. The SPE module 181, the SPE module 182, the audio mixer 171, and the audio mixer 172 are configured to subtract the downlink audio signal 1 and the downlink audio signal 2 from audio signals (including the downlink audio signal 1 played by the speaker 121, the downlink audio signal 2 played by the speaker 122, and the second ambient noise signal) collected by the error microphone 142, to obtain a feedback noise signal. The FB module 112 is configured to obtain a feedback phase-inverted noise signal 1 based on the feedback noise signal. The FB module 114 is configured to obtain a feedback phase-inverted noise signal 2 based on the feedback noise signal. The reference microphone 141 collects a first ambient noise signal, and the FF module 111 is configured to obtain a feed-forward phase-inverted noise signal 1 based on the first ambient noise signal collected by the reference microphone 141. The FF module 113 is configured to obtain a feed-forward phase-inverted noise signal 2 based on the first ambient noise signal collected by the reference microphone 141. The audio mixer 151 performs audio mixing on the feedback phase-inverted noise signal 1 and the feed-forward phase-inverted noise signal 1 to obtain a phase-inverted noise signal 1. The audio mixer 152 performs audio mixing on the feedback phase-inverted noise signal 2 and the feed-forward phase-inverted noise signal 2 to obtain a phase-inverted noise signal 2. The audio mixer 153 performs audio mixing on the phase-inverted noise signal 1 and the phase-inverted noise signal 2 to obtain a phase-inverted noise signal. The audio mixer 161 performs audio mixing on the phase-inverted noise signal and the downlink audio signal 1 to obtain a mixed audio signal 1. The audio mixer 161 provides the mixed audio signal 1 to the power drive circuit 131. The power drive circuit 131 performs power amplification on the mixed audio signal 1, and drives the speaker 121 to play a power-amplified mixed audio signal 1. The audio mixer 162 performs audio mixing on the phase-inverted noise signal and the downlink audio signal 2 to obtain a mixed audio signal 2. The audio mixer 162 provides the mixed audio signal 2 to the power drive circuit 132. The power drive circuit 132 performs power amplification on the mixed audio signal 2, and drives the speaker 122 to play a power-amplified mixed audio signal 2. Phase-inverted noise signals in the power-amplified mixed audio signal 1 and the power-amplified mixed audio signal 2 are used to cancel or partially cancel the ambient noise, to achieve noise cancellation effect.

A specific structure of the active noise cancellation module shown in FIG. 4 or FIG. 8 includes one FF module and one FB module, that is, one path of ANC. It is difficult to implement good fitting on an entire low frequency, a medium frequency, and a high frequency. Compared with the specific structure of the active noise cancellation module shown in FIG. 4 or FIG. 8, the active noise cancellation module shown in FIG. 9 includes two FF modules and two FB modules, that is, two paths of parallel ANC. The two paths of parallel ANC help improve fitting performance of the filter in the active noise cancellation module, improve noise cancellation effect, and improve robustness of active noise cancellation of the headset.

For example, when an error occurs in fitting of the active noise cancellation module shown in FIG. 9 on a specific frequency band, or a fitted target curve has a specific offset due to a change of an acoustic path of the headset, a filtering response may be finely tuned through the other path of parallel ANC when one path of ANC remains unchanged, so that the noise cancellation effect of the active noise cancellation module can be improved.

Figure 10:
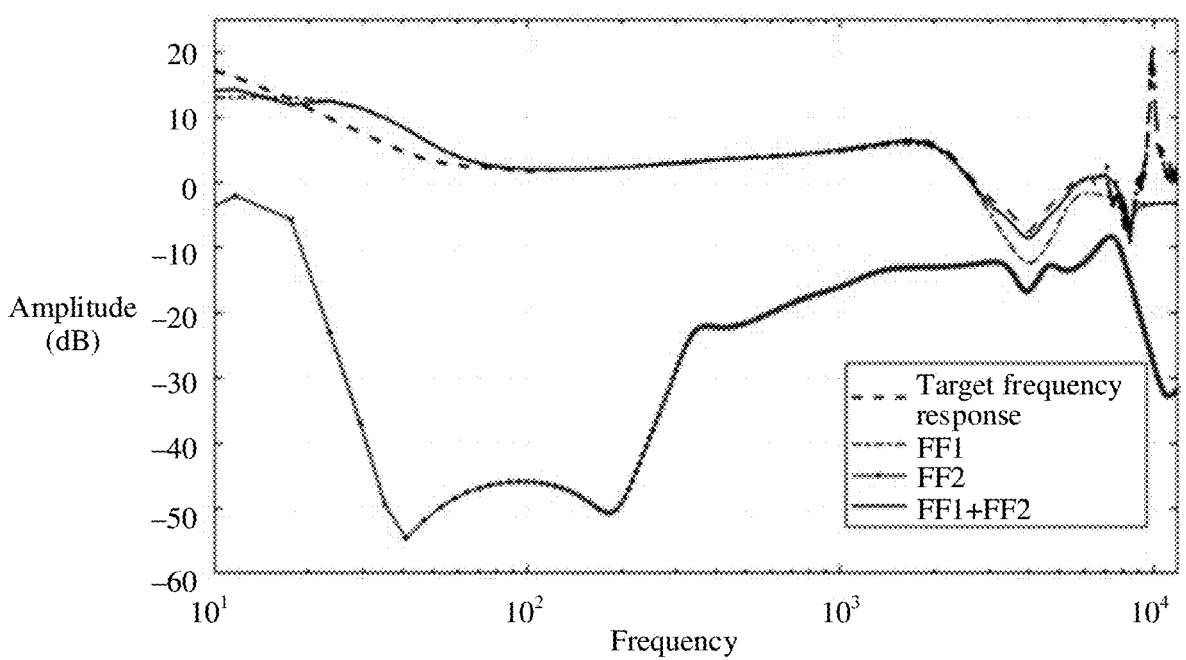
FIG. 10 is a schematic diagram of a filtering frequency response of an example headset with an active noise cancellation function in a structure shown in FIG. 9 according to an embodiment of this application.
Figure 11:
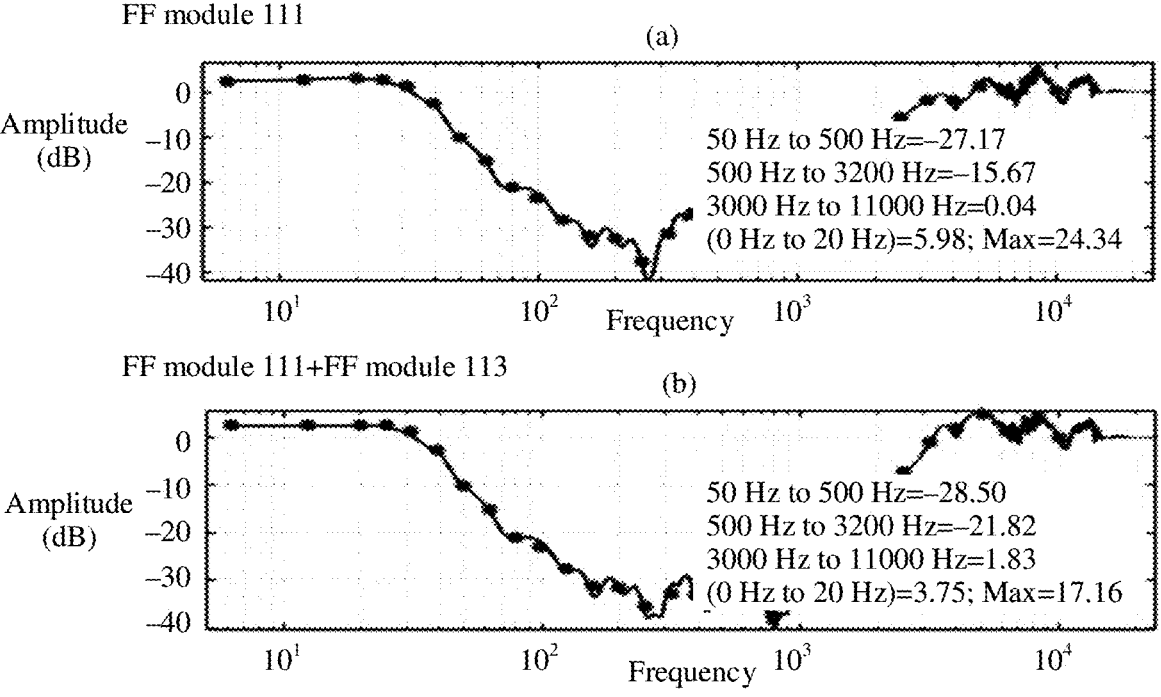
FIG. 11 is a schematic diagram of noise cancellation effect of an example headset with an active noise cancellation function in a structure shown in FIG. 9 according to an embodiment of this application.

The following is an example of parallel FF optimization. For a headset with an active noise cancellation function that includes the structure shown in FIG. 9, a parameter optimization design of the FF module 111 is completed, to obtain a corresponding filtering frequency response shown in FIG. 10, and corresponding noise cancellation effect is shown in (a) in FIG. 11. Although the FF module 111 has achieved good noise cancellation effect, because a quantity of filters and an order of the filter in the FF module 111 are limited or a filter fitting capability is limited, the filtering frequency response of the FF module 111 is still different from a target frequency response on some frequency bands. Therefore, the parallel FF module 113 may be further used to further finely tune and optimize deficiencies of the filtering frequency response of the FF module 111. Finally, a filtering frequency response obtained under combined effect of the FF module 111 and the FF module 113 is closer to the target frequency response, and noise cancellation effect achieved under the combined effect is also significantly improved, as shown in (b) in FIG. 11.

A frequency band-based fitting design of the parallel ANC helps improve robustness of active noise cancellation of the headset. To obtain low-frequency noise cancellation effect, a filtering module (for example, the FF module 111, the FF module 113, the FB module 112, or the filtering module in the FB module 114) in the active noise cancellation module usually needs to increase a gain on a low frequency, to generate a sufficient low-frequency phase-inverted noise signal, and the low-frequency phase-inverted noise signal can be superimposed with a low-frequency noise signal in an environment for cancellation. However, there are some low-frequency and high-noise signal scenarios in the environment, such as a car/bus driving at a high speed, a bus crossing a barrier, and closing a door. These low-frequency and high-noise signals are collected into the filtering module in the active noise cancellation module by the microphone. After a gain of the filtering module is further increased, clipping caused by overflow occurs, and consequently noise such as pop is generated. There is a limiter module in the FF module 111, the FF module 113, the FB module 112, and the FB module 114, to resolve this problem. The limiter module monitors a value of an input signal in real time, and compares the value with a specified threshold. If the value exceeds the specified threshold, a gain value is multiplied by the value of the current input signal, to ensure that a multiplication result falls below the threshold. The working principle may be briefly described as output=gain*input. The input signal is monitored in real time and the gain value is continuously adjusted. When the value of the input signal exceeds the specified threshold, the gain value quickly decreases from 1 to ensure that the value of an output signal is quickly restored to a value below the threshold. After the value of the input signal falls below the threshold, the gain value is gradually restored to 1 to ensure that the input signal is not suppressed by the gain. Because the gain value is directly applied to a time-domain signal, a decrease in the gain value causes a decrease in a gain of the output signal on an entire frequency band in frequency domain.

For the headset structure with a single FF module or FB module, when the low-frequency and high-noise signal triggers a limiter, the gain value decreases to ensure that the output signal does not generate noise such as pop due to clipping. However, because the gain value suppresses the original signal, an output gain of the phase-inverted noise signal output by the filtering module on the entire frequency band in frequency domain is reduced. As a result, active noise cancellation effect on the entire frequency band is weakened, and a smaller gain value indicates poor noise cancellation effect. A change of noise cancellation effect caused in a limiter triggering process is also easily perceived by the user, resulting in poor noise cancellation experience.

Figure 12A:
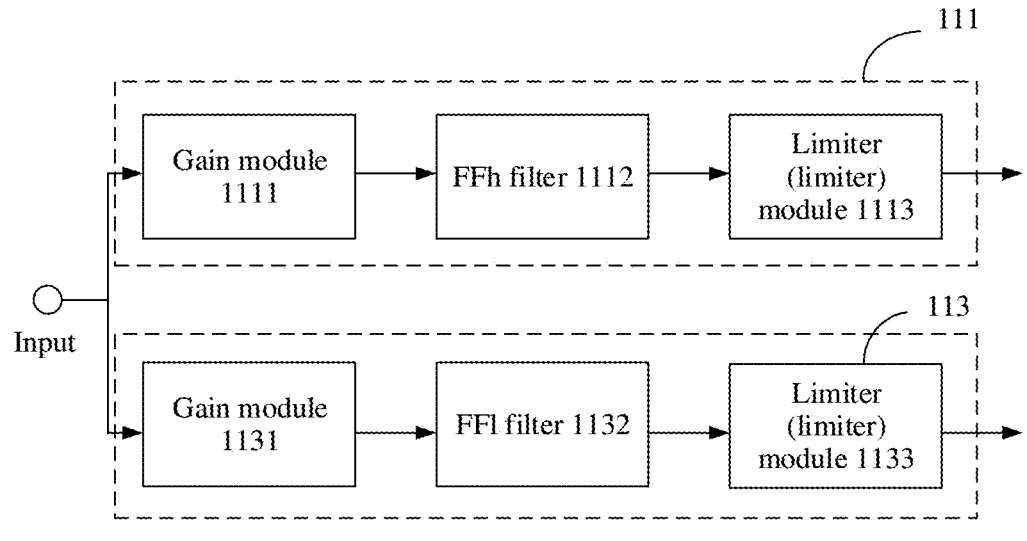
FIG. 12A is a schematic diagram of an example structure of an FF module 111 and an FF module 113 according to an embodiment of this application.
Figure 12B:
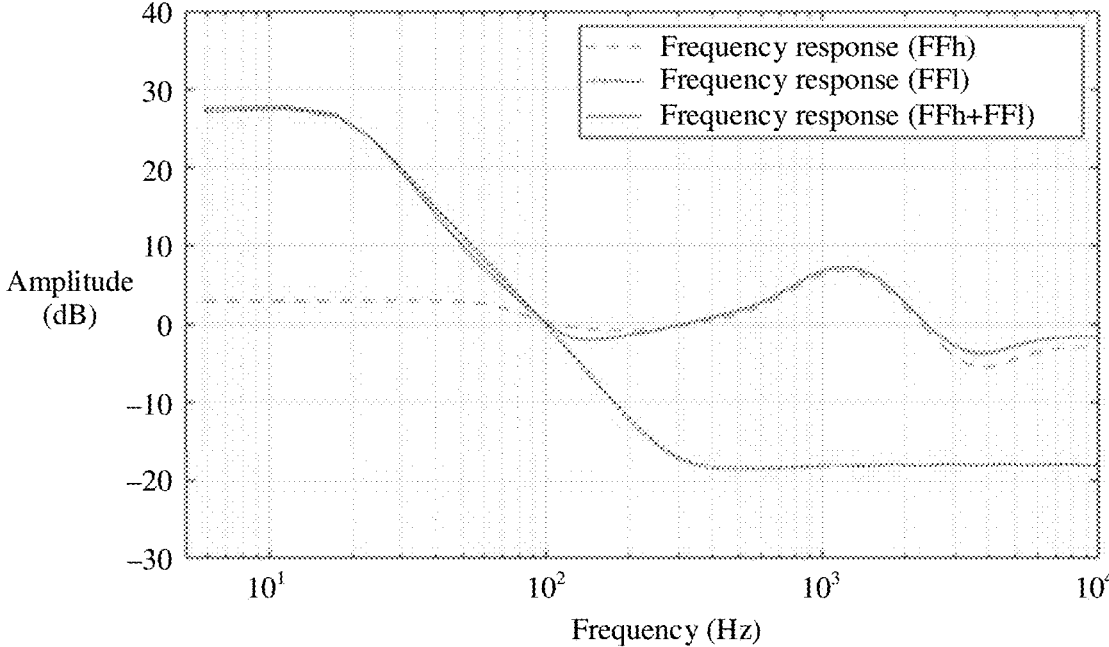
FIG. 12B is a schematic diagram of frequency responses of FFh, FFl, and FFh+FFl according to an embodiment of this application.

Through the two paths of parallel ANC in this embodiment, a frequency band-based fitting design of the filtering parameters in the active noise cancellation module can improve robustness of active noise cancellation of the headset. The parallel FF module is used as an example. The filters respectively included in the FF module 111 and the FF module 113 have different frequency characteristics. As shown in FIG. 12A, the FF module 111 may include a gain module 1111, an FFh filter 1112, and a limiter module 1113, and the FF module 113 may include a gain module 1131, an FFl filter 1132, and a limiter module 1133. The FFh filter 1112 is used to perform target fitting on medium and high frequency bands, to ensure noise cancellation on the medium and high frequency bands, and maintain a low frequency response gain on a low frequency band. The FFl filter 1132 is used to perform target fitting on a low frequency band, to ensure noise cancellation effect on the low frequency band, and maintain an extremely low frequency response gain on medium and high frequency bands. For example, with reference to FIG. 12B, a frequency response curve corresponding to FFh is a frequency response curve obtained when only the FFh filter 1112 is used, and a crossover frequency is about 100 Hz. The FFh filter 1112 can ensure noise cancellation effect at a frequency above 100 Hz, and a gain at a frequency below 100 Hz is limited to a value below 3 dB, which can basically ensure that a low-frequency noise signal is not excessively large and does not trigger the limiter. For example, with reference to FIG. 12B, a frequency response curve corresponding to FFl is a frequency response curve obtained when only the FFl filter 1132 is used. The FFl filter 1132 can suppress a gain at a frequency above 100 Hz, and increase a gain at a frequency below 100 Hz by 20+dB, to ensure noise cancellation effect on the low frequency band. A frequency response curve corresponding to FFh+FFl is a frequency response curve of a parallel ANC filter in this embodiment. It can be seen from FIG. 12B that when the low-frequency and high-noise signal occurs, because a low-frequency gain of the FFh filter 1112 is not increased, the limiter is not triggered, and an output signal of the FFh filter 1112 is not suppressed by the gain; and because a low-frequency gain of the FFl filter 1132 is increased, the limiter is triggered, and an output signal of the FFl filter 1132 is suppressed by the gain. In this way, in outputs of the entire parallel structure, only an output of a low-frequency phase-inverted noise signal is suppressed, and a medium-high-frequency phase-inverted noise signal is not affected. Therefore, when the low-frequency and high-noise signal triggers the limiter, only the noise cancellation effect on the low frequency is affected in the parallel structure, the effect change is less likely to be perceived by the user, and the parallel structure has better noise cancellation experience than the single-FF solution.

It should be noted that the foregoing two paths of parallel ANC are used as an example for description. Three or four paths of parallel ANC may alternatively be used as an example. An implementation principle of the three or four paths of parallel ANC is similar to that of the two paths of parallel ANC. Examples are not described one by one in this embodiment.

According to the headset with the active noise cancellation function in this embodiment, the two power drive circuits each drive one speaker to play the phase-inverted noise signal and the downlink audio signal. In this way, higher output energy can be provided for the headset. When the headset is used to play an audio in a low-frequency and high-noise scenario, the headset has a high low-frequency output capability and high low-frequency sensitivity, thereby helping improve noise cancellation effect of the headset in the low-frequency and high-noise scenario and avoiding pop noise. A plurality of paths of parallel ANC can improve filtering fitting effect, thereby improving active noise cancellation performance of the headset. In addition, filtering parameters of the plurality of paths of parallel ANC are properly set to implement frequency band-based fitting. This can improve robustness of active noise cancellation of the headset.

In another implementation of the headset structure shown in FIG. 3, there are a plurality of phase-inverted noise signals, for example, M phase-inverted noise signals, where M is greater than 1. To be specific, the active noise cancellation module 11 provides M phase-inverted noise signals for audio mixing with M downlink audio signals. Correspondingly, the active noise cancellation module 11 is configured to perform audio mixing on the M downlink audio signals and corresponding phase-inverted noise signals to obtain M mixed audio signals. The plurality of power drive circuits (131, 132, . . . , 13K) each are configured to: perform power amplification on one of the M mixed audio signals based on respective output powers, and then play the amplified mixed audio signal by using the corresponding speaker.

In some embodiments, the M phase-inverted noise signals include M feed-forward phase-inverted noise signals, and the active noise cancellation module 11 may include M FF modules and M fourth audio mixing circuits. Each input end of the M FF modules is connected to the at least one reference microphone, and each output end of the M FF modules is connected to an input end of one of the M fourth audio mixing circuits. The M FF modules are configured to obtain the M feed-forward phase-inverted noise signals based on at least one first ambient noise signal. The M fourth audio mixing circuits are configured to perform audio mixing on the M downlink audio signals and corresponding feed-forward phase-inverted noise signals to obtain the M mixed audio signals.

In some embodiments, the headset with the active noise cancellation function further includes an error microphone. The active noise cancellation module further includes a third audio mixing circuit, M SPE modules, M FB modules, and M fifth audio mixing circuits. Input ends of the M SPE modules are configured to receive M downlink audio signals. Output ends of the M SPE modules are separately connected to an input end of the third audio mixing circuit. An output end of the third audio mixing circuit is connected to input ends of the M FB modules. Each output end of the M FB modules and each output end of the M FF modules are connected to an input end of a corresponding fifth audio mixing circuit. The error microphone is configured to collect the mixed audio signal played by a plurality of speakers and a second ambient noise signal. The M SPE modules and the third audio mixing circuit are configured to obtain a feedback noise signal based on the mixed audio signal played by the plurality of speakers and the second ambient noise signal that are collected by the error microphone, and the M downlink audio signals. The M FB modules are configured to obtain M feedback phase-inverted noise signals based on the feedback noise signal. The M fifth audio mixing circuits are respectively configured to perform audio mixing on feed-forward phase-inverted noise signals of the corresponding FF modules and feedback phase-inverted noise signals of the corresponding FB modules to obtain the M phase-inverted noise signals. The M fourth audio mixing circuits are configured to perform audio mixing on the M downlink audio signals and corresponding phase-inverted noise signals to obtain the M mixed audio signals.

A headset structure in which the active noise cancellation module 11 provides a plurality of phase-inverted noise signals for audio mixing with the M downlink audio signals may also be referred to as a multi-ANC structure. In the multi-ANC structure, different speakers are driven based on different phase-inverted noise signals, that is, different phase-inverted noise signals are played by different speakers. The active noise cancellation module 11 in the multi-ANC structure may include a plurality of FF modules, a plurality of FF modules and one FB module, a plurality of FB modules, a plurality of FB modules and one FF module, or a plurality of FB modules and a plurality of FF modules. This may be properly set based on a requirement.

Figure 13:
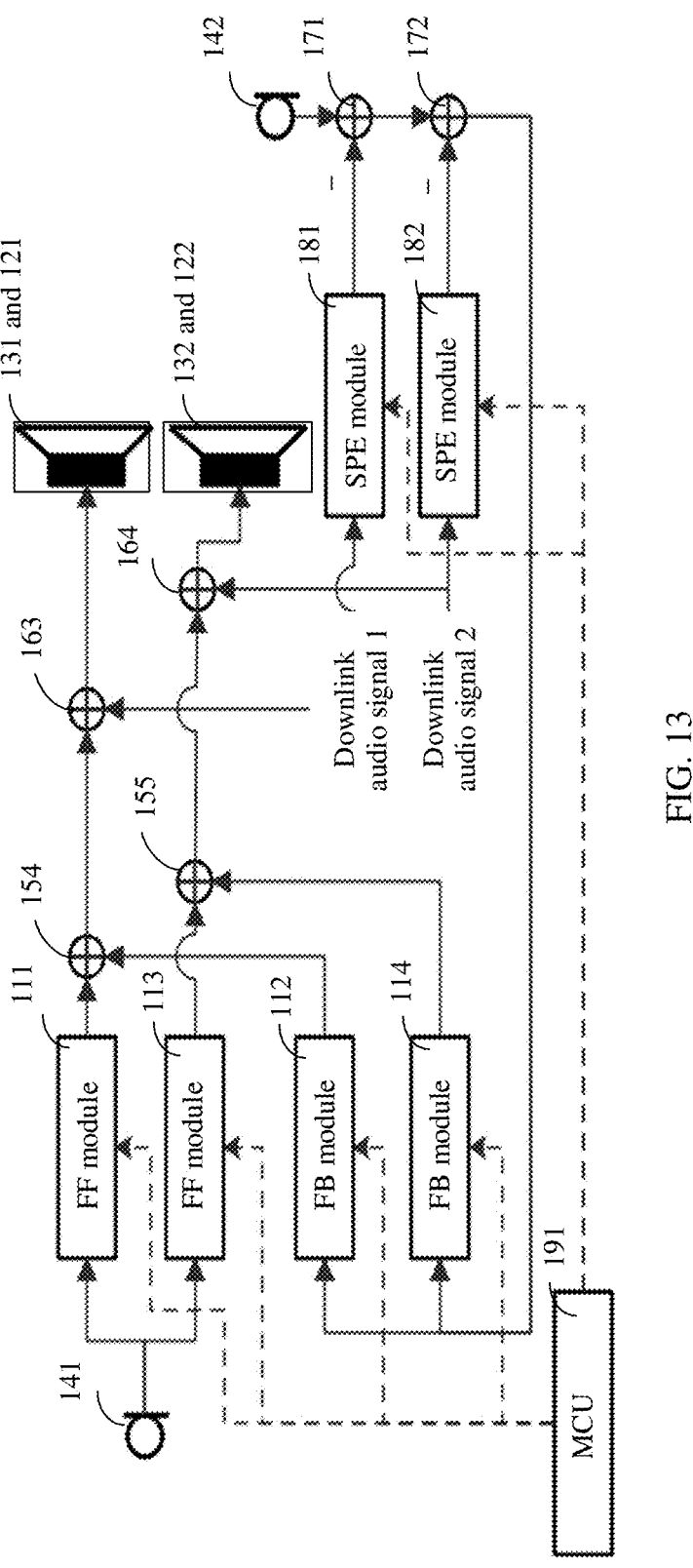
FIG. 13 is a schematic diagram of an example headset with an active noise cancellation function according to an embodiment of this application.

For example, the description is provided by using an example in which the headset with the active noise cancellation function includes one reference microphone, two (N=2) speakers, two (K=2) power drive circuits, and two (M=2) FF modules. FIG. 13 is a schematic diagram of the headset with the active noise cancellation function according to an embodiment of this application. As shown in FIG. 13, the active noise cancellation module 11 in the headset with the active noise cancellation function provided in this embodiment may include an FF module 111, an FF module 113, an FB module 112, and an FB module 114. The active noise cancellation module 11 may further include two (M=2) fifth audio mixing circuits and two (M=2) fourth audio mixing circuits. One fifth audio mixing circuit in the two (M=2) fifth audio mixing circuits includes an audio mixer 154, and the other fifth audio mixing circuit includes an audio mixer 155. One fourth audio mixing circuit in the two (M=2) fourth audio mixing circuits includes an audio mixer 163, and the other fourth audio mixing circuit includes an audio mixer 164. The active noise cancellation module 11 may further include a third audio mixing circuit and two (M=1) SPE modules. The third audio mixing circuit includes an audio mixer 171 and an audio mixer 172. The two SPE modules are respectively an SPE module 181 and an SPE module 183. As shown in FIG. 13, an output end of a reference microphone 141 is separately connected to respective input ends of the FF module 111 and the FF module 113, and an output end of an error microphone 142 and an output end of the SPE module 181 are separately connected to the audio mixer 171. An input end of the SPE module 181 is configured to receive a downlink audio signal 1. An output end of the audio mixer 171 and an output end of the SPE module 182 are separately connected to an input end of the audio mixer 172, and the input end of the SPE module 182 is configured to receive a downlink audio signal 2. An output end of the audio mixer 172 is separately connected to respective input ends of the FB module 112 and the FB module 114, and an output end of the FB module 112 and an output end of the FF module 111 are separately connected to an input end of the audio mixer 154. An output end of the audio mixer 154 is connected to an input end of the audio mixer 163. The audio mixer 163 further includes the other input end, configured to receive the downlink audio signal 1. An output end of the audio mixer 163 is connected to an input end of the power drive circuit 131, and an output end of the power drive circuit 131 is connected to an input end of the speaker 121. An output end of the FB module 114 and an output end of the FF module 113 are separately connected to an input end of the audio mixer 155. An output end of the audio mixer 155 is connected to one input end of the audio mixer 164. The audio mixer 164 further includes the other input end, configured to receive the downlink audio signal 2. An output end of the audio mixer 164 is connected to an input end of the power drive circuit 132, and the output end of the power drive circuit 132 is connected to an input end of the speaker 122.

A working principle of the headset with the active noise cancellation function shown in FIG. 13 is as follows: The error microphone 142 collects the downlink audio signal 1 played by the speaker 121, the downlink audio signal 2 played by the speaker 122, and a second ambient noise signal. The SPE module 181, the SPE module 182, the audio mixer 171, and the audio mixer 172 are configured to subtract the downlink audio signal 1 and the downlink audio signal 2 from audio signals (including the downlink audio signal 1 played by the speaker 121, the downlink audio signal 2 played by the speaker 122, and the second ambient noise signal) collected by the error microphone 142, to obtain a feedback noise signal. The FB module 112 is configured to obtain a feedback phase-inverted noise signal 1 based on the feedback noise signal. The FB module 114 is configured to obtain a feedback phase-inverted noise signal 2 based on the feedback noise signal. The reference microphone 141 collects a first ambient noise signal, and the FF module 111 is configured to obtain a feed-forward phase-inverted noise signal 1 based on the first ambient noise signal collected by the reference microphone 141. The FF module 113 is configured to obtain a feed-forward phase-inverted noise signal 2 based on the first ambient noise signal collected by the reference microphone 141. The audio mixer 154 performs audio mixing on the feedback phase-inverted noise signal 1 and the feed-forward phase-inverted noise signal 1 to obtain a phase-inverted noise signal 1. The audio mixer 163 performs audio mixing on the phase-inverted noise signal 1 and the downlink audio signal 1 to obtain a mixed audio signal 1. The audio mixer 163 provides the mixed audio signal 1 to the power drive circuit 131. The power drive circuit 131 performs power amplification on the mixed audio signal 1, and drives the speaker 121 to play a power-amplified mixed audio signal 1. The audio mixer 154 performs audio mixing on the feedback phase-inverted noise signal 2 and the feed-forward phase-inverted noise signal 2 to obtain a phase-inverted noise signal 2. The audio mixer 164 performs audio mixing on the phase-inverted noise signal 2 and the downlink audio signal 2 to obtain a mixed audio signal 2. The audio mixer 164 provides the mixed audio signal 2 to the power drive circuit 132. The power drive circuit 132 performs power amplification on the mixed audio signal 2, and drives the speaker 122 to play a power-amplified mixed audio signal. Phase-inverted noise signals in the power-amplified mixed audio signal 1 and the power-amplified mixed audio signal 2 are used to cancel or partially cancel the ambient noise, to achieve noise cancellation effect.

The headset with the active noise cancellation function shown in FIG. 13 may further include a micro control unit (MCU) 191. The MCU 191 is configured to control, configure, or modify parameters in the FF module 111, the FF module 113, the FB module 112, the FB module 114, the SPE module 181, and the SPE module 182.

The headset in this embodiment has two paths of ANC, one path of ANC includes the FF module 111 and the FB module 112, and the other path of ANC includes the FF module 113 and the FB module 114. In addition, two speakers: the speaker 121 and the speaker 122, are independent of each other. One path of ANC in the two paths of ANC and the power drive circuit 131 drive the speaker 121, and the other path of ANC and the power drive circuit 132 drive the speaker 122. In this way, respective characteristics of the two speakers can be fully used, to maximize advantages of each speaker on all frequency bands.

For example, both the speaker 121 and the speaker 122 are full-frequency speakers. The speaker 121 focuses on medium and low frequency bands, to be specific, frequency responses of the speaker 121 on the medium and low frequency bands are better than frequency responses on other frequency bands. The speaker 122 focuses on medium and high frequency bands, to be specific, frequency responses of the speaker 122 on the medium and high frequency bands are better than frequency responses on other frequency bands. In this way, one path of ANC may be set to focus on noise cancellation on medium and low frequency bands, and the other path of ANC may be set to focus on noise cancellation on medium and high frequency bands, so that the headset with the foregoing structure can have good noise cancellation effect on all frequency bands (for example, the low frequency band, the medium frequency band, and the high frequency band). For example, the medium and low frequency bands may be 50 Hz to 500 Hz, and the medium and high frequency bands may be 500 Hz to 3.2 kHz. A specific frequency band range may be properly set based on a requirement.

Figure 14:
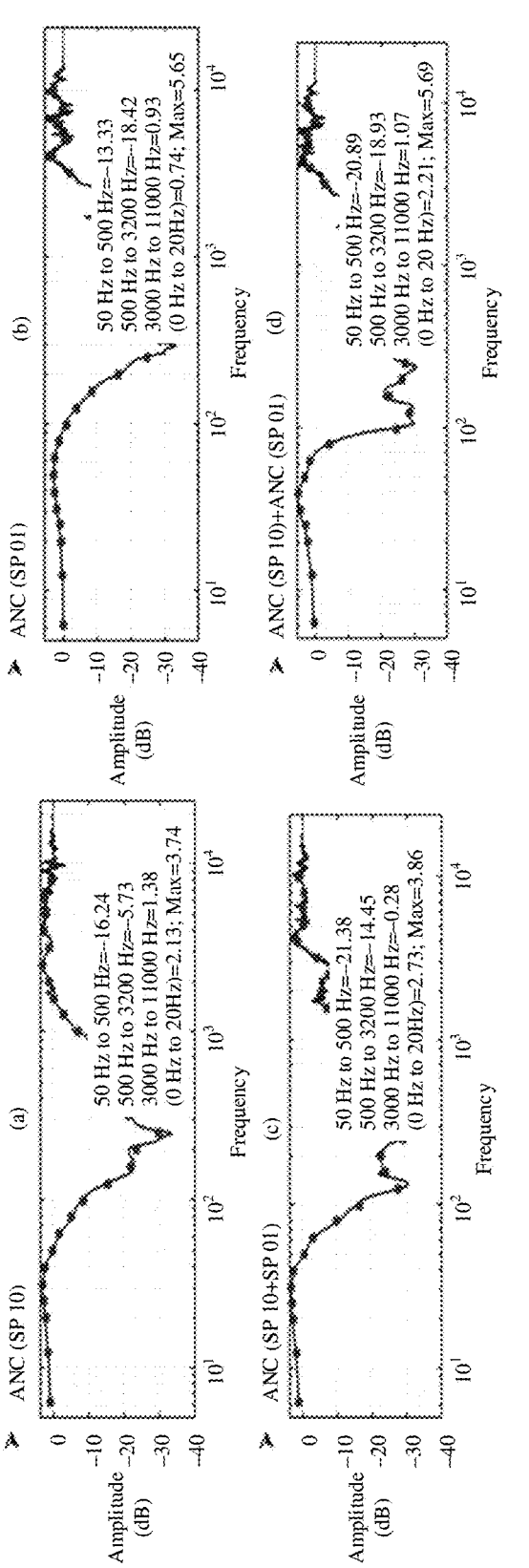
FIG. 14 is an example schematic diagram of noise cancellation effect achieved in different ANC modes according to an embodiment of this application.

For example, FIG. 14 is an example schematic diagram of noise cancellation effect achieved in different ANC modes according to an embodiment of this application. In this embodiment, the description is provided by using an example in which the speaker 121 focuses on the medium and low frequency bands and the speaker 122 focuses on the medium and high frequency bands. An SP corresponding to the speaker 121 is an SP 10, and an SP corresponding to the speaker 122 is an SP 01. (a) in FIG. 14 shows a noise cancellation curve of ANC obtained when only the speaker 121 works. Herein, the ANC (SP 10) represents this ANC mode. (b) in FIG. 14 shows a noise cancellation curve of ANC obtained when only the speaker 122 works. Herein, the ANC (SP 01) represents this ANC mode. (c) in FIG. 14 shows a noise cancellation curve of ANC obtained when the active noise cancellation module provides one phase-inverted noise signal to drive both the speaker 121 and the speaker 122 to work, in other words, the headset structure shown in FIG. 9 and an ANC mode in which both the speaker 121 and the speaker 122 work are used. Herein, the ANC (SP 10+SP 01) represents this ANC mode. (d) in FIG. 14 shows a noise cancellation curve of ANC obtained when the active noise cancellation module provides two phase-inverted noise signals to respectively drive the speaker 121 and the speaker 122 to work, in other words, the headset structure shown in FIG. 13 and the noise cancellation curve obtained when both the speaker 121 and the speaker 122 work are used. Herein, the ANC (SP 10)+ANC (SP 01) represents this ANC mode.

For noise cancellation amount statistics corresponding to the foregoing four ANC modes, refer to Table 1. With reference to FIG. 14 and Table 1, it can be learned that the ANC (SP 10) has good noise cancellation effect on the medium and low frequency bands because the speaker 121 is a horn with a better response on the medium and low frequency bands. The ANC (SP 01) has better noise cancellation effect on the medium and high frequency bands because the speaker 122 also has a better medium and high frequency response characteristic. Noise cancellation performance on the medium and low frequency bands in the ANC (SP 10+SP 01) is better than that in only the ANC (SP 10) or ANC (SP 01). Noise cancellation performance on the medium and high frequency bands in the ANC (SP 10+SP 01) is between that of the ANC (SP 10) and that of the ANC (SP 01). The ANC (SP 10)+ANC (SP 01) fully utilizes advantages of the two speakers. Noise cancellation effect in the ANC (SP 10)+ANC (SP 01) is better than that of other modes on the medium and low frequency bands and the medium and high frequency bands. Therefore, when the active noise cancellation module in this embodiment provides the two phase-inverted noise signals to respectively drive the speaker 121 and the speaker 122 to work, a corresponding ANC parameter may be optimized based on a frequency characteristic of the speaker. The ANC parameter is a parameter related to the active noise cancellation module, for example, a filter parameter in a module such as an FF module or an FB module. Therefore, advantages of different speakers on different frequency bands are fully utilized, to improve noise cancellation performance of the headset.

TABLE 1

| Statistics table of noise cancellation amounts corresponding to different ANC modes | | |
|---|---|---|
| | Noise cancellation amount statistics (⅓ octave) | |
| ANC mode | 50 Hz to 500 Hz | 0.5 kHz to 3.2 kHz |
| ANC (SP 10) | −16.24 dB | −5.73 dB |
| ANC (SP 01) | −13.33 dB | −18.42 dB |
| ANC (SP 10 + SP 01) | −21.38 dB | −14.45 dB |
| ANC (SP 10) + ANC (SP 01) | −20.89 dB | −18.93 dB |

It should be noted that the foregoing two speakers may alternatively be combined in another different manner. This embodiment is not limited to the foregoing example. For example, one speaker in the two speakers is a low-frequency speaker, and the other speaker is a high-frequency speaker.

One speaker in the two speakers is a low-frequency speaker, and the other speaker is a full-frequency speaker. Alternatively, one speaker in the two speakers is a high-frequency speaker, and the other speaker is a full-frequency speaker.

According to the headset with the active noise cancellation function in this embodiment, the two power drive circuits each drive one speaker to play the phase-inverted noise signal and the downlink audio signal. In this way, higher output energy can be provided for the headset. When the headset is used to play an audio in a low-frequency and high-noise scenario, the headset has a high low-frequency output capability and high low-frequency sensitivity, thereby helping improve noise cancellation effect of the headset in the low-frequency and high-noise scenario and avoiding pop noise. In addition, the two paths of ANC each drive one speaker, and frequency response advantages of each speaker on different frequency bands can be fully utilized, so that the ANC function of the headset can achieve good noise cancellation effect on different frequency bands.

Figure 15:
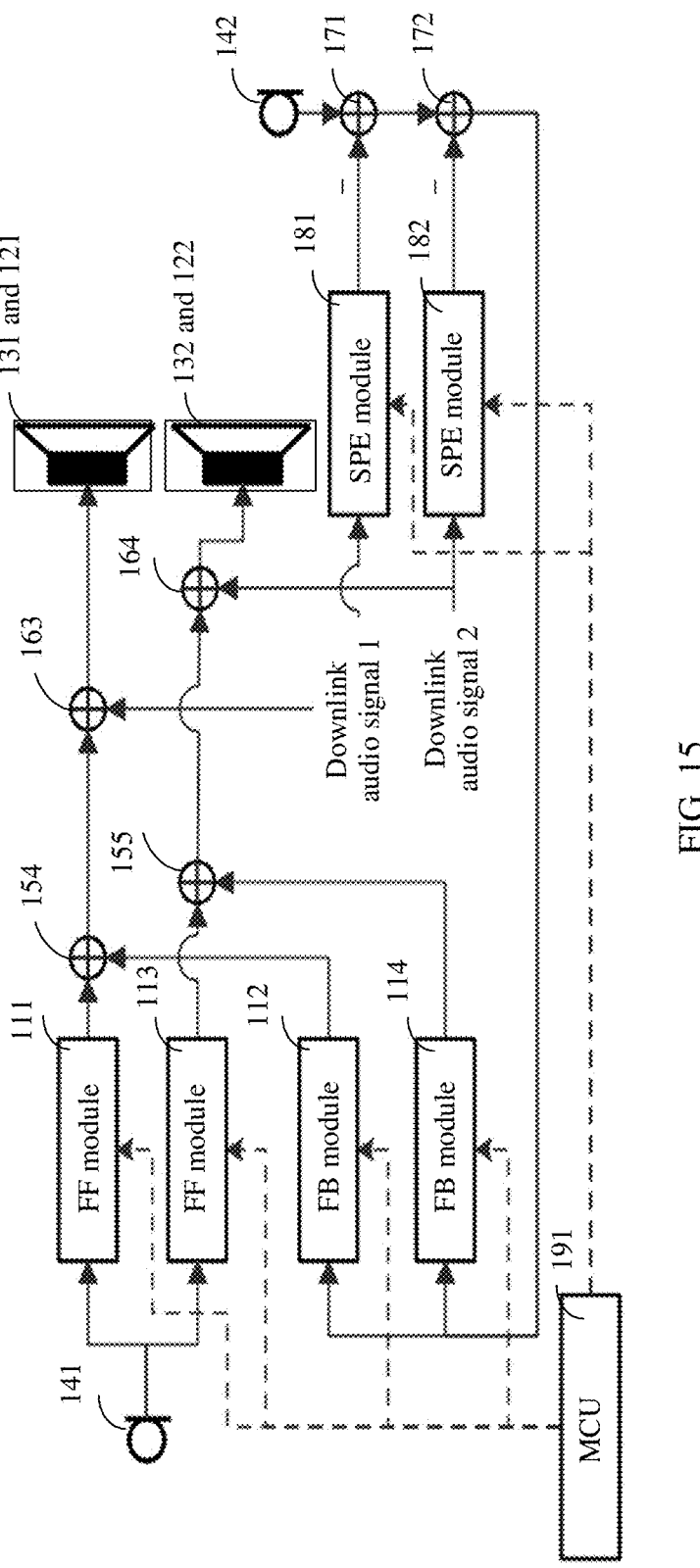
FIG. 15 is a schematic diagram of an example headset with an active noise cancellation function according to an embodiment of this application.

Different from the headset structure including one reference microphone shown in FIG. 13, this embodiment further provides a headset structure shown in FIG. 15. The headset may include a plurality of reference microphones. In this embodiment, two reference microphones are used as an example for description. FIG. 15 is an example schematic diagram of the headset with the active noise cancellation function according to an embodiment of this application. As shown in FIG. 15, the headset includes the reference microphone 141 and a reference microphone 143. An output end of the reference microphone 141 is connected to an input end of the FF module 111 and an input end of the FF module 113, and an output end of the error microphone 142 and an output end of the SPE module 181 are separately connected to the audio mixer 171. An input end of the SPE module 181 is configured to receive a downlink audio signal 1. An output end of the audio mixer 171 and an output end of the SPE module 182 are separately connected to an input end of the audio mixer 172, and an input end of the SPE module 182 is configured to receive a downlink audio signal 2. An output end of the audio mixer 172 is separately connected to respective input ends of the FB module 112 and the FB module 114, and an output end of the FB module 112 and an output end of the FF module 111 are separately connected to an input end of the audio mixer 154. An output end of the audio mixer 154 is connected to an input end of the audio mixer 163. The audio mixer 163 further includes the other input end, configured to receive the downlink audio signal 1. An output end of the audio mixer 163 is connected to an input end of the power drive circuit 131, and an output end of the power drive circuit 131 is connected to an input end of the speaker 121. An output end of the FB module 114 and an output end of the FF module 113 are separately connected to an input end of the audio mixer 155. An output end of the audio mixer 155 is connected to one input end of the audio mixer 164. The audio mixer 164 further includes the other input end, configured to receive the downlink audio signal 2. An output end of the audio mixer 164 is connected to an input end of the power drive circuit 132, and the output end of the power drive circuit 132 is connected to an input end of the speaker 122.

Different reference microphones may be disposed at different locations, to obtain more external noise signals, especially directional noise signals. Therefore, correlation between a signal collected by the reference microphone and an in-ear signal can be improved. This helps optimize noise cancellation effect by the FF module.

Based on any one of the foregoing headset structures, the headset may further include a storage module. The storage module may store a plurality of groups of parameters, so that the MCU determines, from the plurality of groups of parameters, a parameter used by the active noise cancellation module 11. The MCU may select a proper parameter from the plurality of groups of parameters based on a user operation or automatic identification, and configure the parameter for the active noise cancellation module 11. The parameter in this embodiment is an ANC parameter, namely, the parameter in the active noise cancellation module, for example, the filter parameter. For example, the main control unit MCU may be configured to: when at least one of acoustic environment information, ambient noise, or noise cancellation requirement information of the user changes, determine, from the plurality of groups of parameters based on the at least one of the acoustic environment information, the ambient noise, or the noise cancellation requirement information of the user, the parameter used by the active noise cancellation module. The acoustic environment information indicates an acoustic environment formed by an ear canal of the user and the headset. The noise cancellation requirement information of the user indicates a noise cancellation strength requirement of the user.

The plurality of groups of parameters may be designed based on different requirements. For example, different parameters are designed for different human ears/wearing postures (different parameters are required for different leakage to achieve optimal noise cancellation effect), different parameters are designed for different ambient noise, or different parameters are designed for different noise cancellation strength.

(1) A plurality of groups of parameters are designed for different leakage formed between the headset and the human ears.

Figure 16:
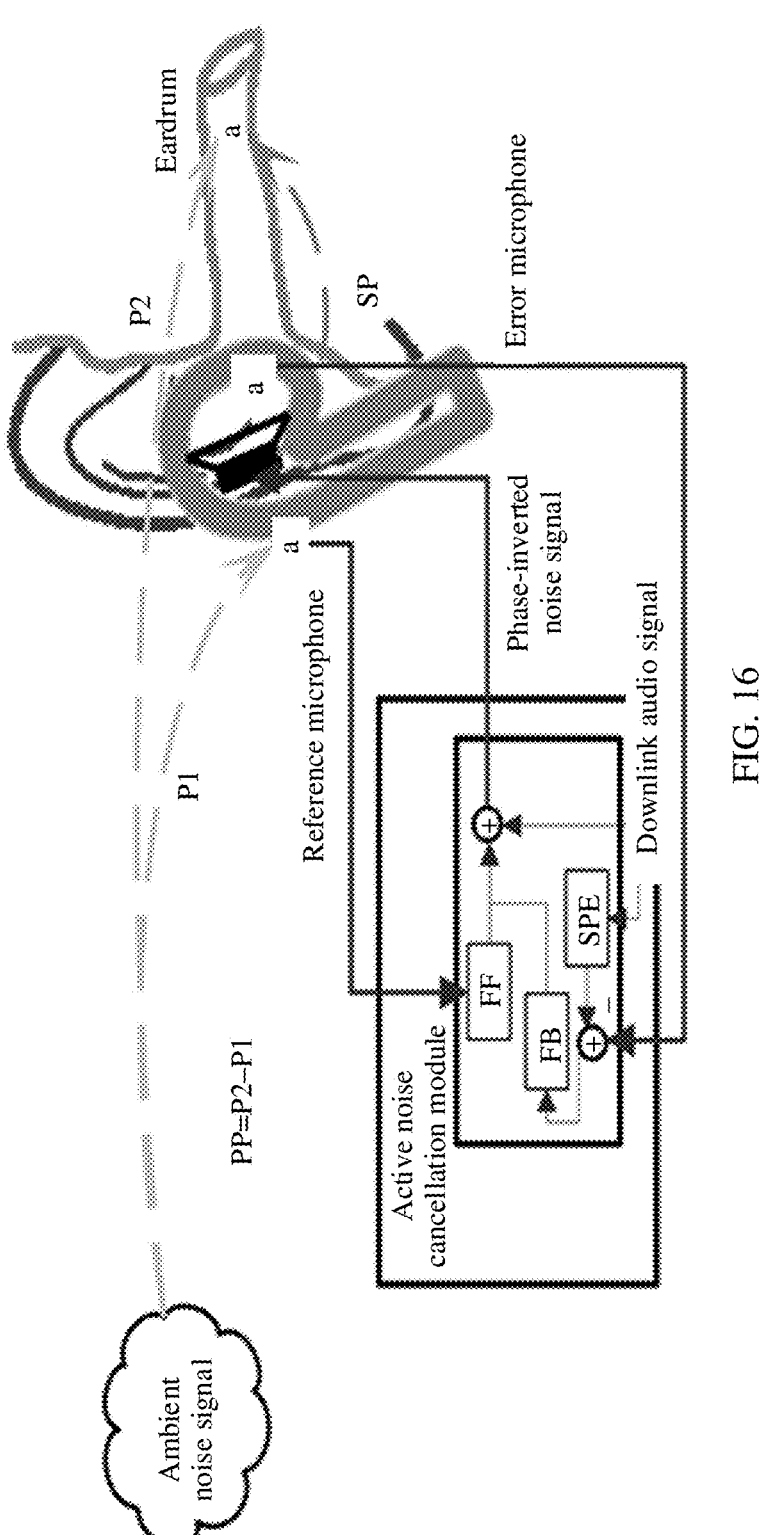
FIG. 16 is an example simplified schematic diagram of ANC active noise cancellation according to an embodiment of this application.

For the headset with the active noise cancellation function, because an acoustic environment formed by the headset and the ear canal changes, an optimal parameter corresponding to the headset varies in different acoustic environments. FIG. 16 is an example simplified schematic diagram of ANC active noise cancellation according to an embodiment of this application. As shown in FIG. 16, leakage formed by the headset in different ears and different wearing postures is different, and SP paths and PP paths are also different. When the PP and the SP (there are a plurality of SPs if there are a plurality of speakers) are determined, a corresponding optimal noise cancellation ANC parameter may also be determined.

As shown in FIG. 16, one speaker and one phase-inverted noise signal are used as an example for description, and another speaker is not shown. Specifically, when the user normally wears the headset with the active noise cancellation function, an external ambient noise signal passes through a reference microphone and an error microphone of the headset, and then is propagated to a tympanic membrane of the human ear and heard by the wearer. The reference microphone collects an ambient noise signal from the outside, the error microphone collects an ambient noise signal from the outside and a downlink audio signal played by a speaker of the headset, and the signals collected by the reference microphone and the error microphone are sent to the active noise cancellation module, processed by the active noise cancellation module, and then transmitted to the speaker. The phase-inverted noise signal played by the speaker is propagated to the ear canal of the wearer. When reaching the tympanic membrane, the phase-inverted noise signal is superimposed with the ambient noise signal transmitted from the outside in an equal amplitude and an opposite phase, to reduce a value of the ambient noise signal and achieve an objective of noise cancellation. After the PP path and the SP path (there are at least two SP paths because there are at least two speakers in this embodiment) shown in FIG. 16 are determined, the ANC parameter may also be basically determined.

FIG. 17 is an equivalent schematic diagram of an example ANC architecture corresponding to FIG. 16 according to an embodiment of this application. As shown in FIG. 17, the ambient noise signal transmitted from the outside is represented as X after being collected by the reference microphone, and is represented as Derp after being collected by the error microphone. An audio signal collected when the external ambient noise signal is transmitted to the eardrum of the human ear is Ddrp. PPdrp indicates a transmission path of the external ambient noise signal from the reference microphone of the headset to the eardrum point of the human ear. PPerp indicates a transmission path of the external ambient noise signal from the reference microphone of the headset to the error microphone. SPerp indicates a transmission path of an audio signal played by the speaker of the headset to an audio signal received by the error microphone. SPdrp indicates a transmission path of the audio signal played by the speaker of the headset to the eardrum point of the human ear. (In this embodiment, there are at least two speakers, and there is one SPerp and one SPdrp for each corresponding speaker.) It may be understood that Yerp indicates an audio signal obtained by superimposing, at the error microphone, the external ambient noise signal and the downlink audio signal played by the speaker. Ydrp indicates a signal obtained by superimposing, at the eardrum, the external ambient noise signal and the downlink audio signal played by the speaker.

The following calculation formula (2) may be obtained based on the foregoing relationship.

$$\begin{cases} Ydrp = Ddrp - (FB*Yerp + X*FF)*SPdrp \\ Yerp = Derp - (FB*Yerp + X*FF)*SPerp \\ Ddrp = X*PPdrp \\ Derp = X*PPerp \end{cases} \quad (2)$$

A noise cancellation amount in the human ear may be further derived according to the following formula (3).

$$\frac{Ydrp}{Ddrp} = 1 - \frac{PPerp*FB*SPdrp + FF*SPdrp}{(1 + FB*SPerp)*PPdrp} \quad (3)$$

The ANC parameter in the active noise cancellation module 11 may be an ANC parameter obtained in an optimization solution manner. For example, the ANC parameter in the active noise cancellation module 11 is optimized, so that a value of the foregoing formula is minimized, that is, optimal noise cancellation effect is achieved. There are a plurality of optimization solution manners for the ANC parameter, for example, an FxLMS adaptive optimization method in time domain or frequency domain, a random search optimization algorithm based on target optimization (for example, a genetic algorithm and a particle swarm algorithm), and biquad/IIR filter-based parameter optimization fitting. All common optimization algorithms for ANC parameter optimization are applicable to this embodiment.

In this embodiment, SP frequency response data and PP frequency response data that are obtained in different human ears or different wearing postures of a same human ear may be collected, corresponding optimal noise cancellation effect may be separately achieved through optimization in the foregoing manner, to obtain a plurality of groups of ANC parameters. The plurality of groups of ANC parameters are stored in the storage module, so that the MCU determines, from the plurality of groups of ANC parameters based on at least one of the acoustic environment information, the ambient noise, or the noise cancellation requirement information of the user, an ANC parameter used by the active noise cancellation module.

For example, a plurality of groups of ANC parameters may be obtained based on different acoustic leakage of different human ears. For example, when an acoustic environment formed by the headset and the human ear corresponds to PP and SP features corresponding to leakage of a small ear and a middle ear, a corresponding optimal ANC parameter may be obtained through optimization. When an acoustic environment formed by the headset and the human ear corresponds to PP and SP features corresponding to leakage of a middle ear and a large ear, a corresponding optimal ANC parameter may be obtained through optimization. Therefore, optimal noise cancellation ANC parameters corresponding to different acoustic leakage may be respectively obtained based on the different acoustic leakage.

When the user uses the headset, matching may be performed based on a leakage amount between the headset and the current user, to use a group of optimal parameters in the plurality of groups of parameters. A matching algorithm is not specifically limited in this embodiment. For example, a disk or a button that is provided on a mobile phone for the user to select a level may be used to select a group of ANC parameters from the plurality of groups of ANC parameters based on the user operation. For another example, a matching detection algorithm may be used to determine, from the plurality of groups of ANC parameters through differentiation and matching of some obvious features (for example, different SP features), an ANC parameter that matches the feature.

(2) A plurality of groups of ANC parameters in other cases

When the user uses the headset with the active noise cancellation function in different environments, for example, an airplane, a subway, a coffee shop, an office, or a shopping mall, spectra of ambient noise signals in these scenarios are significantly different. Therefore, different ANC parameters may be obtained through optimization based on different ambient noise signals, and a plurality of groups of ANC parameters are stored in the storage module, to ensure that appropriate ANC parameters match the different scenarios.

In addition, when using the headset with the active noise cancellation function, the user also has a specific requirement on noise cancellation strength. Therefore, a plurality of groups of ANC parameters may be designed based on different noise cancellation strength requirements, to provide different choices of noise cancellation strength for the user.

For the headset structure shown in any one of the foregoing embodiments, a plurality of groups of ANC parameters may be set in the storage module in the foregoing manner, to improve active noise cancellation effect of the headset in different scenarios, and meet different noise cancellation requirements of different users.

FIG. 18 is a schematic flowchart of an example active noise cancellation method according to an embodiment of this application. The method may be applied to the headset with the active noise cancellation function described in the foregoing embodiments. As shown in FIG. 18, the active noise cancellation method in this embodiment may include the following steps.

Step 1801: Obtain at least one first ambient noise signal collected by at least one reference microphone.

Step 1802: Obtain at least one phase-inverted noise signal based on the at least one first ambient noise signal.

The at least one phase-inverted noise signal is used to partially or totally cancel ambient noise.

In an implementation, a quantity of the at least one phase-inverted noise signal is one. The step 1802 may be specifically: obtaining at least one feed-forward phase-inverted noise signal based on the at least one first ambient noise signal; and performing audio mixing on at least one feed-forward phase-inverted noise signal to obtain one phase-inverted noise signal.

In some embodiments, the method may further include: obtaining the mixed audio signal played by a plurality of speakers and a second ambient noise signal that are collected by an error microphone; obtaining a feedback noise signal based on the mixed audio signal played by the plurality of speakers and the second ambient noise signal that are collected by the error microphone, and M downlink audio signals; obtaining at least one feedback phase-inverted noise signal based on the feedback noise signal; and performing audio mixing on the at least one feed-forward phase-inverted noise signal and the at least one feedback phase-inverted noise signal to obtain the phase-inverted noise signal.

In an implementation, a quantity of the at least one phase-inverted noise signal is M. When M is greater than 1, the step 1802 may be specifically: obtaining M feed-forward phase-inverted noise signals based on the at least one first ambient noise signal; and obtaining M phase-inverted noise signals based on the M feed-forward phase-inverted noise signals.

In some embodiments, the method may further include: obtaining the mixed audio signal played by a plurality of speakers and a second ambient noise signal that are collected by an error microphone; and obtaining a feedback noise signal based on the mixed audio signal played by the plurality of speakers and the second ambient noise signal that are collected by the error microphone, and M downlink audio signals; obtaining M feedback phase-inverted noise signals based on the feedback noise signal; and respectively performing audio mixing on the M feedback phase-inverted noise signals and corresponding feed-forward phase-inverted noise signals to obtain the M phase-inverted noise signals.

Step 1803: Perform audio mixing on the M downlink audio signals and the at least one phase-inverted noise signal to obtain at least one mixed audio signal.

When there are M phase-inverted noise signals, and M is greater than 1, audio mixing may be performed on the M downlink audio signals and corresponding phase-inverted noise signals to obtain M mixed audio signals.

Step 1804: Perform power amplification on the at least one mixed audio signal based on a plurality of output powers to obtain at least one power-amplified mixed audio signal; and play the at least one power-amplified mixed audio signal by using the plurality of speakers.

In some embodiments, the method further includes: when at least one of acoustic environment information, ambient noise, or noise cancellation requirement information of a user changes, determining, from a plurality of groups of parameters based on the at least one of the acoustic environment information, the ambient noise, or the noise cancellation requirement information of the user, a parameter used by an active noise cancellation module.

The acoustic environment information indicates an acoustic environment formed by an ear canal of the user and the headset, and the parameter used by the active noise cancellation module is used to generate the at least one phase-inverted noise signal.

For example, the noise cancellation requirement information of the user may be obtained from an electronic device connected to the headset. For example, the electronic device is a mobile phone. The mobile phone may display, based on a user operation, a user interface including an active noise cancellation function option. When detecting an operation, performed by the user on the user interface, for enabling an active noise cancellation function, the mobile phone may display a noise cancellation requirement adjustment knob in the user interface in response to the operation for enabling the active noise cancellation function. When detecting an operation performed by the user on the adjustment knob, in response to the operation on the adjustment knob, the mobile phone determines the noise cancellation requirement information of the user, and sends the noise cancellation requirement information to the headset connected to the mobile phone. The headset determines, from the plurality of groups of parameters based on the noise cancellation requirement information of the user, the parameter used by the active noise cancellation module.

In this embodiment, the plurality of speakers are driven based on the plurality of output powers to play the phase-inverted noise signal and the downlink audio signal. In this way, more output powers can be used to provide higher output energy for the headset, to improve noise cancellation performance of the headset. When the headset is used to play an audio in a low-frequency and high-noise scenario, the headset has a high low-frequency output capability, thereby helping improve noise cancellation effect of the headset in the low-frequency and high-noise scenario and robustness of active noise cancellation and avoiding pop noise. The low-frequency and high-noise scenario may include a stable low-frequency and high-noise scenario and a transient low-frequency and high-noise scenario. For example, a stable low-frequency and high-noise scenario may be a scenario such as public transportation or air travel. The transient low-frequency and high-noise scenario may be a scenario such as a bus crossing a barrier, a train passing through a cave, or closing a door.

The foregoing descriptions about implementations allow a person skilled in the art to understand that, for the purpose of convenient and brief description, division into the foregoing functional modules is used as an example for illustration. In actual application, the foregoing functions may be allocated to different functional modules for implementation based on a requirement, that is, an inner structure of an apparatus is divided into different functional modules to implement all or some of the functions described above. For a detailed working process of the foregoing system, apparatus, and unit, refer to a corresponding process in the foregoing method embodiment.

In the several embodiments provided in this application, it should be understood that the disclosed method may be implemented in another manner. For example, the described apparatus embodiments are merely examples. For example, division into the modules or units is merely logical function division and may be other division during actual implementation. For example, a plurality of units or components may be combined or integrated into another system, or some features may be ignored or may not be performed. In addition, the displayed or discussed mutual couplings or direct couplings or communication connections may be implemented through some interfaces. The indirect couplings or communication connections between the modules or units may be implemented in electronic, mechanical, or other forms.

The units described as separate parts may or may not be physically separate, and parts displayed as units may or may not be physical units, may be located at one location, or may be distributed on a plurality of network units. Some or all of the units may be selected based on actual requirements to achieve the objectives of the solutions of embodiments.

In addition, functional units in embodiments of this application may be integrated into one processing unit, each of the units may exist independently physically, or two or more units may be integrated into one unit. The integrated unit may be implemented in a form of hardware, or may be implemented in a form of a software functional unit.

When the integrated unit is implemented in the form of the software functional unit and sold or used as an independent product, the integrated unit may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, a network device, or the like) or a processor to perform all or some of the steps of the method described in embodiments of this application. The foregoing storage medium includes any medium that can store program instructions, for example, a flash memory, a removable hard disk, a read-only memory, a random access memory, a magnetic disk, or an optical disc.

The foregoing descriptions are merely non-limiting examples of specific implementations and are not intended to limit the protection scope, which is intended to cover any variation or replacement readily determined by a person of ordinary skill in the art. Therefore, the claims shall define the protection scope.

What is claimed is:

1. A headset with an active noise cancellation function, wherein the headset comprises:

an active noise cancellation module including at least one circuit, a plurality of speakers, a plurality of power drive circuits, and at least one reference microphone, wherein an output end of any one of the plurality of power drive circuits is connected to at least one of the plurality of speakers, and the active noise cancellation module is connected between the at least one reference microphone and input ends of the plurality of power drive circuits;

the at least one reference microphone is configured to collect at least one first ambient noise signal;

the active noise cancellation module is configured to obtain at least one phase-inverted noise signal based on the at least one first ambient noise signal;

the active noise cancellation module is further configured to perform audio mixing on M downlink audio signals and the at least one phase-inverted noise signal to obtain at least one mixed audio signal, wherein M is any positive integer, and the M downlink audio signals come from an electronic device connected to the headset;

the plurality of power drive circuits is configured to perform power amplification on the at least one mixed audio signal based on respective output powers to obtain at least one power-amplified mixed audio signal; and the plurality of speakers is configured to play the at least one power-amplified mixed audio signal, wherein the at least one phase-inverted noise signal comprises M feed-forward phase-inverted noise signals, the active noise cancellation module comprises M FF modules and M fourth audio mixing circuits, and the M fourth audio mixing circuits are configured to perform audio mixing on the M downlink audio signals and corresponding feed-forward phase-inverted noise signals to obtain the M mixed audio signals.

2. The headset according to claim 1, wherein a quantity of the at least one phase-inverted noise signal is one; and the active noise cancellation module is configured to separately perform audio mixing on the M downlink audio signals and one phase-inverted noise signal to obtain M mixed audio signals.

3. The headset according to claim 2, wherein the active noise cancellation module comprises a first audio mixing circuit, a second audio mixing circuit, and at least one feed-forward (FF) module;

the at least one FF module is configured to obtain at least one feed-forward phase-inverted noise signal based on the at least one first ambient noise signal;

the first audio mixing circuit is configured to perform audio mixing on the at least one feed-forward phase-inverted noise signal to obtain the phase-inverted noise signal; and the second audio mixing circuit is configured to separately perform audio mixing on the M downlink audio signals and the phase-inverted noise signal to obtain the M mixed audio signals.

4. The headset according to claim 3, wherein the headset further comprises an error microphone; the active noise cancellation module further comprises a third audio mixing circuit, M secondary path estimation (SPE) modules, and at least one feedback (FB) module; input ends of the M SPE modules are configured to receive the M downlink audio signals, output ends of the M SPE modules are separately connected to an input end of the third audio mixing circuit, an output end of the third audio mixing circuit is connected to an input end of the at least one FB module, and an output end of the at least one FB module is connected to the first audio mixing circuit;

the error microphone is configured to collect the mixed audio signal played by the plurality of speakers and a second ambient noise signal;

the M SPE modules and the third audio mixing circuit are configured to obtain a feedback noise signal based on the mixed audio signal played by the plurality of speakers and the second ambient noise signal that are collected by the error microphone, and the M downlink audio signals;

the at least one FB module is configured to obtain at least one feedback phase-inverted noise signal based on the feedback noise signal; and the first audio mixing circuit is configured to perform audio mixing on the at least one feed-forward phase-inverted noise signal and the at least one feedback phase-inverted noise signal to obtain the phase-inverted noise signal.

5. The headset according to claim 4, wherein, when the active noise cancellation module comprises a plurality of FB modules, filters comprised in the plurality of FB modules have different frequency characteristics.

6. The headset according to claim 3, wherein, when the active noise cancellation module comprises a plurality of FF modules, filters comprised in the plurality of FF modules have different frequency characteristics.

7. The headset according to claim 6, wherein the different frequency characteristics comprise different frequency ranges, or a same frequency range but different amplitude-frequency characteristics or phase-frequency characteristics corresponding to at least one frequency band range.

8. The headset according to claim 1, wherein, when M is greater than 1, the active noise cancellation module is configured to respectively perform audio mixing on the M downlink audio signals and corresponding phase-inverted noise signals to obtain M mixed audio signals.

9. The headset according to claim 8, wherein
each input end of the M FF modules is connected to the at least one reference microphone, and each output end of the M FF modules is connected to an input end of one of the M fourth audio mixing circuits; and
the M FF modules are configured to obtain the M feed-forward phase-inverted noise signals based on the at least one first ambient noise signal.

10. The headset according to claim 9, wherein
the headset further comprises an error microphone;
the active noise cancellation module further comprises a third audio mixing circuit, M SPE modules, M FB modules, and M fifth audio mixing circuits;
input ends of the M SPE modules are configured to receive the M downlink audio signals, output ends of the M SPE modules are separately connected to an input end of the third audio mixing circuit, an output end of the third audio mixing circuit is connected to input ends of the M FB modules, and each output end of the M FB modules and each output end of the M FF modules are connected to an input end of a corresponding fifth audio mixing circuit;
the error microphone is configured to collect the mixed audio signal played by the plurality of speakers and a second ambient noise signal;
the M SPE modules and the third audio mixing circuit are configured to obtain a feedback noise signal based on the mixed audio signal played by the plurality of speakers and the second ambient noise signal that are collected by the error microphone, and the M downlink audio signals;
the M FB modules are configured to obtain M feedback phase-inverted noise signals based on the feedback noise signal;
the M fifth audio mixing circuits are respectively configured to perform audio mixing on the feed-forward phase-inverted noise signals of the corresponding FF modules and the feedback phase-inverted noise signals of the corresponding FB modules to obtain the at least one phase-inverted noise signal; and
the M fourth audio mixing circuits are configured to perform audio mixing on the M downlink audio signals and corresponding phase-inverted noise signals to obtain the M mixed audio signals.

11. The headset according to claim 1, further comprising a main control unit (MCU) configured to determine a parameter used by the active noise cancellation module.

12. The headset according to claim 11, wherein the MCU is configured to: when acoustic environment information, ambient noise, or noise cancellation requirement information of a user changes, determine, from a plurality of groups of parameters based on the acoustic environment information, the ambient noise, and/or the noise cancellation requirement information of the user, the parameter used by the active noise cancellation module; and
the acoustic environment information indicates an acoustic environment formed by an ear canal of the user and the headset.

13. An active noise cancellation method, comprising:
obtaining at least one first ambient noise signal collected by at least one reference microphone;
obtaining at least one phase-inverted noise signal based on the at least one first ambient noise signal;
performing audio mixing on M downlink audio signals and the at least one phase-inverted noise signal to obtain at least one mixed audio signal, wherein M is any positive integer, and the M downlink audio signals come from an electronic device connected to a headset;
performing power amplification on the at least one mixed audio signal based on a plurality of output powers to obtain at least one power-amplified mixed audio signal; and
playing the at least one power-amplified mixed audio signal by using a plurality of speakers,
wherein a quantity of the at least one phase-inverted noise signal is M, and when M is greater than 1, the performing audio mixing on M downlink audio signals and the at least one phase-inverted noise signal to obtain at least one mixed audio signal comprises:
respectively performing audio mixing on the M downlink audio signals and corresponding phase-inverted noise signals to obtain M mixed audio signals, and
wherein the obtaining at least one phase-inverted noise signal based on the at least one first ambient noise signal comprises;
obtaining M feed-forward phase-inverted noise signals based on the at least one first ambient noise signal, and
obtaining M phase-inverted noise signals based on the M feed-forward phase-inverted noise signals.

14. The method according to claim 13, wherein, when a quantity of the at least one phase-inverted noise signal is one, the obtaining at least one phase-inverted noise signal based on the at least one first ambient noise signal comprises:
obtaining at least one feed-forward phase-inverted noise signal based on the at least one first ambient noise signal; and
performing audio mixing on the at least one feed-forward phase-inverted noise signal to obtain one phase-inverted noise signal.

15. The method according to claim 14, further comprising:
obtaining the mixed audio signal played by the plurality of speakers and a second ambient noise signal that are collected by an error microphone;
obtaining a feedback noise signal based on the mixed audio signal played by the plurality of speakers and the second ambient noise signal that are collected by the error microphone, and the M downlink audio signals; and
obtaining at least one feedback phase-inverted noise signal based on the feedback noise signal, wherein
when the quantity of the at least one phase inverted noise signal is one, the performing audio mixing on the at least one feed-forward phase-inverted noise signal to obtain one phase-inverted noise signal comprises:
performing audio mixing on the at least one feed-forward phase-inverted noise signal and the at least one feedback phase-inverted noise signal to obtain the one phase-inverted noise signal.

16. The method according to claim 13, wherein M is greater than 1.

17. The method according to claim 13, further comprising:

obtaining the mixed audio signal played by the plurality of speakers and a second ambient noise signal that are collected by an error microphone;

obtaining a feedback noise signal based on the mixed audio signal played by the plurality of speakers and the second ambient noise signal that are collected by the error microphone, and the M downlink audio signals; and obtaining M feedback phase-inverted noise signals based on the feedback noise signal, wherein the obtaining M phase-inverted noise signals based on the M feed-forward phase-inverted noise signals comprises:

respectively performing audio mixing on the M feedback phase-inverted noise signals and corresponding feed-forward phase-inverted noise signals to obtain the at least one phase-inverted noise signal.

18. The method according to claim 13, further comprising:

when acoustic environment information, ambient noise, or noise cancellation requirement information of a user changes, determining, from a plurality of groups of parameters based on the acoustic environment information, the ambient noise, and/or the noise cancellation requirement information of the user, a parameter used by an active noise cancellation module, wherein the acoustic environment information indicates an acoustic environment formed by an ear canal of the user and the headset, and the parameter used by the active noise cancellation module is used to generate the at least one phase-inverted noise signal.

19. An audio system with an active noise cancellation function, wherein the audio system comprises an electronic device and a headset, the electronic device establishes a connection to the headset, and the headset comprises:

an active noise cancellation module including at least one circuit, a plurality of speakers, a plurality of power drive circuits, and at least one reference microphone, wherein an output end of any one of the plurality of power drive circuits is connected to at least one of the plurality of speakers, and the active noise cancellation module is connected between the at least one reference microphone and input ends of the plurality of power drive circuits;

the at least one reference microphone is configured to collect at least one first ambient noise signal;

the active noise cancellation module is configured to obtain at least one phase-inverted noise signal based on the at least one first ambient noise signal;

the active noise cancellation module is further configured to perform audio mixing on M downlink audio signals and the at least one phase-inverted noise signal to obtain at least one mixed audio signal, wherein M is any positive integer, and the M downlink audio signals come from an electronic device connected to the headset;

the plurality of power drive circuits is configured to perform power amplification on the at least one mixed audio signal based on respective output powers to obtain at least one power-amplified mixed audio signal; and the plurality of speakers is configured to play the at least one power-amplified mixed audio signal, wherein the at least one phase-inverted noise signal comprises M feed forward phase-inverted noise signals, the active noise cancellation module comprises M FF modules and M fourth audio mixing circuits, and the M fourth audio mixing circuits are configured to perform audio mixing on the M downlink audio signals and corresponding feed-forward phase-inverted noise signals to obtain the M mixed audio signals.

* * * * *